United States Patent
Moebert et al.

(10) Patent No.: US 11,631,168 B2
(45) Date of Patent: Apr. 18, 2023

(54) METHOD, COMPUTER PROGRAM AND APPARATUS FOR DETERMINING A QUALITY OF A MASK OF A PHOTOLITHOGRAPHY APPARATUS

(71) Applicant: Carl Zeiss SMT GmbH, Oberkochen (DE)

(72) Inventors: Tom Moebert, Gera (DE); Dirk Seidel, Jena-Leutra (DE); Carsten Schmidt, Jena (DE); Konrad Schoebel, Weimar (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 315 days.

(21) Appl. No.: 16/912,951

(22) Filed: Jun. 26, 2020

(65) Prior Publication Data
US 2020/0410656 A1    Dec. 31, 2020

(30) Foreign Application Priority Data
Jun. 28, 2019    (DE) .......................... 102019117558.5

(51) Int. Cl.
*G06K 9/00*    (2022.01)
*G06T 7/00*    (2017.01)
*G03F 1/84*    (2012.01)

(52) U.S. Cl.
CPC ................ *G06T 7/001* (2013.01); *G03F 1/84* (2013.01); *G06T 2207/20056* (2013.01); *G06T 2207/30148* (2013.01)

(58) Field of Classification Search
CPC .......... G06T 7/001; G06T 2207/20056; G06T 2207/30148; G03F 1/84
See application file for complete search history.

(56) References Cited

U.S. PATENT DOCUMENTS

| | | | |
|---|---|---|---|
| 7,027,143 B1 | 4/2006 | Stokowski et al. | |
| 9,207,544 B2* | 12/2015 | Matejka | G03F 7/705 |
| 2005/0198973 A1* | 9/2005 | Clarke | F16K 11/0873 62/51.1 |
| 2006/0048090 A1* | 3/2006 | Feldman | G03F 7/705 716/51 |
| 2006/0114453 A1* | 6/2006 | Goldenshtein | G03F 7/70666 356/237.1 |

(Continued)

FOREIGN PATENT DOCUMENTS

| | | | |
|---|---|---|---|
| DE | 102013101445 | 8/2014 | ............ G01M 11/02 |
| DE | 102018207880 | 11/2019 | ............ G06F 17/50 |

(Continued)

OTHER PUBLICATIONS

Office Action issued by the German Patent Office for Application No. DE 10 2019 117 558.7, dated Dec. 22, 2021 (with English Translation).

(Continued)

*Primary Examiner* — Samir A Ahmed
(74) *Attorney, Agent, or Firm* — Fish & Richardson P.C.

(57) ABSTRACT

Methods and apparatuses for determining a quality of a mask of a photolithography apparatus are provided, which comprise a parallel calculation, using a plurality of computing devices, of a reference aerial image on the basis of a design of the mask and optical properties of the photolithography apparatus on a plurality of computing devices.

16 Claims, 13 Drawing Sheets

(56) References Cited

U.S. PATENT DOCUMENTS

| | | | |
|---|---|---|---|
| 2010/0128969 A1* | 5/2010 | Cao | G06T 3/0056 382/144 |
| 2012/0320183 A1* | 12/2012 | Matejka | G03F 7/705 348/79 |
| 2015/0346608 A1 | 12/2015 | Seidel et al. | |
| 2015/0379707 A1* | 12/2015 | Tsuchiya | G06T 7/001 348/126 |
| 2016/0171153 A1* | 6/2016 | Van Rooyen | G16B 30/00 702/20 |
| 2016/0180019 A1* | 6/2016 | Van Rooyen | G16B 50/30 702/19 |
| 2018/0293720 A1* | 10/2018 | Yoshitake | G03F 7/20 |

FOREIGN PATENT DOCUMENTS

| | | | | |
|---|---|---|---|---|
| WO | WO 01/54046 | * | 7/2001 | |
| WO | WO 2013/100927 | * | 7/2013 | |
| WO | WO 2019/219826 | | 11/2019 | G03F 7/20 |

OTHER PUBLICATIONS

Adam, K., "Domain Decomposition Methods for the Electromagnetic Simulation of Scattering from Three-Dimensional Structures with Applications in Lithography", PhD Thesis, EECS Department, University of California, Berkeley (2001).

Allen, G. D., "Chapter 5, Hemutian Theory", *Lectures on Linear Algebra and Matrices*, Department of Mathematics, Texas A&M University, College Station, Texas, pp. 181-196 (Sep. 22, 2003).

Flynn, M. J., "Some Computer Organizations and Their Effectiveness", *IEEE Transactions on Computers*, vol. C-21, No. 9, pp. 948-960 (Sep. 1972).

Garetto, A., et al., "Aerial imaging technology for photomask qualification: from a microscope to a metrology tool", *Advanced Optical Technologies*, vol. 1, No. 4, pp. 289-298 (2012).

Cuda, German Wikipedia, 6 pages, https://de.wikipedia.org/w/index.php?title=CUDA&oldid=188338305 (downloaded on Oct. 27, 2021).

Gong, P., et al., "Fast aerial image simulations for partially coherent systems by transmission cross coefficient decomposition with analytical kernels", *Journal of Vacuum Science & Technology B Microelectronics and Nanometer Structures*, vol. 30, No. 6, pp. 06FG03-1-06FG03-7 (Nov./Dec. 2012).

Hopkins, H. H., "The concept of partial coherence in optics", *Proceedings of the Royal Society of London A: Mathematical, Physical and Engineering Sciences*, vol. 208, No. 1093, pp. 263-277 (1951).

Jia, N. et al., "Machine learning for inverse lithography: Using stochastic gradient descent for robust photomask synthesis", *Journal of Optics*, vol. 12, pp. 1-9 (2010).

Kirchauer, H., "Photolithography Simulation", Dissertation, Section 4 and Appendix B, Institute for Microelectronics, TU Vienna (Apr. 17, 1998).

Seidel, D., et al., "Improving registration metrology by correlation methods based on alias-free image simulation", *Proceedings of SPIE*, vol. 7823, pp. 78232N-1-7823N-9 (2010).

Wu, X., et al., "Comparison of three TCC calculation algorithms for partially coherent imaging simulation", *Proceedings of SPIE*, vol. 7544, pp. 75440Z-1-75440Z-10 (2010).

Yamazoe, K., "Computation theory of partially coherent imaging by stacked pupil shift matrix", *Journal of Optical Society of America A*, vol. 25, No. 12, pp. 3111-3119 (Dec. 2008).

Yamazoe, K., "Two models for partially coherent imaging", *Journal of Optical Society of America A*, vol. 29, No. 12, pp. 2591-2597 (Dec. 2012).

* cited by examiner

```
function I = part_coh_imaging_Hopkins(T, K, L, J)
% partial coherent imaging using Hopkins method
[N,M,Z] = size(K);
I = zeros(N,M,Z);
S = length(L);
for ik = 1:S
    temp = circshift(T,[imag(L(ik)), real(L(ik))]);
    temp = ifft2(repmat(temp,[1,1,Z]) .* K);
    I = I + J(ik) .* abs(temp) .^ 2;
end
```

```
for (int i = 0; i < S; ++i)
{
   mult_circshift3D (fft_temp , T, K, L(i));

//  execute an inverse 2D FFT in-place
   IFT (fft_temp, Z)

accumulate_image (I , fft_temp, J(i)) ;
}
```

Fig. 8C

```
1  __global__ void mult_circshift3D_kernel (complex_real_t *restrict fft_temp,
       dim3 size , short2 L, const complex_real_t *restrict T, const
       complex_real_t *restrict K)
   {
3     // grid stride loops in case our grid is not as big as our data
      for (unsigned int y = threadIdx. y + blockIdx. y * blockDim. y; y < size. y;
5         y += blockDim. y * gridDim. y)
      {
7       for (unsigned int x = threadIdx. x + blockIdx. x * blockDim. x;
             x < size. x; x += blockDim. x * gridDim. x)
9       {
          const unsigned int shifted_x = (x - L. x + size. x) % size. x;
11        const unsigned int shifted_y = (y - L. y + size. y) % size. y;
          const unsigned int spec_idx = shifted_x + shifted_y * size. x;
13        const complex_real_t specC = T [spec_idx];

15        const unsigned int arr_idx = x + y * size. x;
          // foreach focus plane
17        for (unsigned int z = threadIdx. z + blockIdx. z * blockDim. z;
              z < size. z; z += blockDim. z * gridDim. z)
19        { const unsigned int ctf_idx = arr_idx + z * size. x * size. y;

complex_real_t ctfC = K[ ctf_idx];
          fft_temp [ctf_idx] = cuCmul (specC, ctfC);
          }
        }
      }
   }
```

Fig. 9

```
__global__ void accumulate_image_kernel(real_t *restrict I, dim3 size,
    const complex_real_t *restrict fft_input, real_t scale)
{
    for (unsigned int y = threadIdx.y + blockIdx.y * blockDim.y;
         y < size.y; y += blockDim.y * gridDim.y)
    {
        for (unsigned int x = threadIdx.x + blockIdx * blockDim.x;
             x < size.x; x += blockDim.x * gridDim.x)
        {
            for (unsigned int z = threadIdx.z + clockIdx.z * blockDim.z;
                 z < size.z; z += blockDim.z * gridDim.z)
            {
                const unsigned int idx = x + y * size.x + z * size.x * size.y;
                const complex_real_t fft = fft_input [idx];
                real_t gain = fft.x * fft.x + fft.y * fft.y
                I [idx] += scale * gain;
            }
        }
    }
}
```

Fig. 10

| N | 601 CPU [s] | 602 GPU Naive [s] | 603 GPU Adv. [s] | 604 GPU Adv.+SM [s] |
|---|---|---|---|---|
| 835 | 38.64 | 2.42 | 1.09 | 1.12 |
| 1671 | 76.91 | 4.44 | 1.81 | 1.92 |
| 2506 | 115.46 | 6.45 | 2.54 | 2.68 |
| 3342 | 153.91 | 8.47 | 3.23 | 3.42 |
| 4177 | 192.41 | 10.48 | 3.95 | 4.15 |
| 5013 | 230.95 | 12.51 | 4.64 | 4.78 |
| 5848 | 270 | 14.53 | 5.34 | 5.49 |
| 6684 | 306.56 | 16.54 | 6.04 | 6.18 |
| 7519 | 347.18 | 18.55 | 6.75 | 6.98 |
| 8355 | 386.08 | 20.58 | 7.46 | 7.57 |
| 9190 | 424.97 | 22.6 | 8.15 | 8.28 |
| 10025 | 461.96 | 24.59 | 8.84 | 8.97 |
| 10861 | 499.92 | 26.63 | 9.55 | 9.66 |
| 11696 | 537.82 | 28.64 | 10.25 | 10.37 |
| 12532 | 575.13 | 30.64 | 10.96 | 11.07 |
| 13367 | 617.73 | 32.69 | 11.7 | 11.85 |
| 14203 | 658.92 | 34.71 | 12.36 | 12.44 |
| 15038 | 695.93 | 36.79 | 13.07 | 13.13 |
| 15874 | 741.56 | 38.75 | 13.77 | 13.84 |
| 16709 | 774.6 | 40.75 | 14.48 | 14.52 |

Figure 5: Benchmark of loopings method with variable number of light points

| N | 701 GPU TCC | 702 Mean deviation | 703 Max devitation |
|---|---|---|---|
| 10 | 0.69 | 0.26 | 0.73 |
| 20 | 0.7 | 0.12 | 0.37 |
| 30 | 0.71 | $5.61 \cdot 10^{-2}$ | 0.18 |
| 40 | 0.72 | $5.61 \cdot 10^{-2}$ | 0.18 |
| 50 | 0.73 | $5.24 \cdot 10^{-2}$ | 0.18 |
| 60 | 0.73 | $2.87 \cdot 10^{-2}$ | $8.66 \cdot 10^{-2}$ |
| 70 | 0.74 | $2.87 \cdot 10^{-2}$ | $8.66 \cdot 10^{-2}$ |
| 80 | 0.74 | $1.77 \cdot 10^{-2}$ | $4.29 \cdot 10^{-2}$ |
| 90 | 0.74 | $1.77 \cdot 10^{-2}$ | $4.29 \cdot 10^{-2}$ |
| 100 | 0.75 | $1.76 \cdot 10^{-2}$ | $4.29 \cdot 10^{-2}$ |

| N | CPU [s] | GPU Single [s] | GPU Double [s] |
|---|---|---|---|
| 3133 | 11.31 | $2.14 \cdot 10^{-2}$ | 0.21 |
| 6266 | 22.17 | $2.99 \cdot 10^{-2}$ | 0.36 |
| 9398 | 33.58 | $3.95 \cdot 10^{-2}$ | 0.54 |
| 12531 | 44.42 | $5.25 \cdot 10^{-2}$ | 0.71 |
| 15664 | 56.1 | $6.7 \cdot 10^{-2}$ | 0.89 |
| 18797 | 67.61 | $7.67 \cdot 10^{-2}$ | 1.07 |
| 21930 | 76.98 | $9.04 \cdot 10^{-2}$ | 1.25 |
| 25062 | 89.52 | 0.1 | 1.42 |
| 28195 | 99.87 | 0.11 | 1.6 |
| 31328 | 110.9 | 0.13 | 1.78 |
| 34461 | 120.48 | 0.14 | 1.96 |
| 37594 | 133.48 | 0.15 | 2.14 |
| 40726 | 143.96 | 0.17 | 2.31 |
| 43859 | 155.18 | 0.18 | 2.49 |
| 46992 | 166.21 | 0.19 | 2.67 |
| 50125 | 176.4 | 0.2 | 2.84 |
| 53258 | 189.05 | 0.21 | 3.02 |
| 56390 | 198.27 | 0.23 | 3.2 |
| 59523 | 207.94 | 0.24 | 3.38 |
| 62656 | 220.7 | 0.25 | 3.55 |

METHOD, COMPUTER PROGRAM AND APPARATUS FOR DETERMINING A QUALITY OF A MASK OF A PHOTOLITHOGRAPHY APPARATUS

CROSS-REFERENCE TO RELATED APPLICATIONS

This application claims priority under 35 U.S.C. § 119 from German Application No. DE 10 2019 117 558.5, filed on Jun. 28, 2019, the entire contents of which are incorporated herein by reference.

TECHNICAL FIELD

Various embodiments relate to the ascertainment of the quality of photolithographic devices or components of these systems by way of parallel calculation.

BACKGROUND

Image simulations of so-called aerial images are carried out to assess photolithographic apparatuses, for example masks that are used in such apparatuses. Such masks are sometimes referred to as photomasks.

Image simulations of such aerial images are indispensable within the scope of the production process of modern photomasks as they form a reliable comparison basis for the real manufactured product and this consequently renders it possible to detect manufacturing faults.

In general, an aerial image is understood to mean the intensity distribution in the image plane of an optical system.

By way of example, aerial images are described in A. Garetto, Th. Scherübl and J. H. Peters, "Aerial imaging technology for photomask qualification: from a microscope to a metrology tool," Adv. Opt. Techn. 2012; 1(4): 289-298.

Aerial images can be defined accordingly in optical systems which have a plurality of image planes. Here, an aerial image can contain information for the plurality of image planes and/or the intensity distribution in the plurality of image planes can be described by a plurality of aerial images.

To reduce the computational demands of such calculations, methods for partially coherent image simulation are known and find use in the simulation of photolithographic apparatuses with a Köhler illumination. Such procedures allow the simulation of optical images of a virtual idealized mask.

Various simplifications for designing the performance of such simulations more time-efficiently and for reducing the computational outlay required are known in their own right.

Kenji Yamazoe, "Computation theory of partially coherent imaging by stacked pupil shift matrix," J. Opt. Soc. Am. A, 25(12):3111-3119, December 2008 and Kenji Yamazoe, "Two models for partially coherent imaging," J. Opt. Soc. Am., A, 29(12): 2591-2597, December 2012 have disclosed mathematical processes for calculating aerial images of photolithography apparatuses with Köhler illumination by means of partially coherent image simulation and by means of the pupil-shift method.

H. Kirchauer, Photolithography Simulation, Technische Universität Wien: Dissertationen der Technischen Universität Wien. Österreichischer Kunst-und Kulturverl., 2000 has disclosed mathematical methods for describing idealized masks with the aid of triangles for partially coherent image simulations.

Despite these procedures and simplifications known in their own right, such optical image simulations are very computationally intensive and therefore require much time for the calculation in known implementations, even on fast computers. In many applications, a plurality of simulations are performed for various conditions, for example for different settings of the photolithographic device. This may be accompanied with the need for significantly more computation time.

A further disadvantage of the known theoretical methods is that simulated images of idealized theoretical masks are obtained on the basis of theoretical assumptions, meaning that an interpretation of the simulation results in view of a physically existing photolithography apparatus may consequently be difficult.

Therefore, there is a need for methods and apparatuses which improve the determination of a quality of masks of photolithography apparatuses.

SUMMARY

A method and an apparatus as defined in the independent patent claims are provided. The features of the dependent patent claims define further embodiments.

A method for determining a quality of a mask of a photolithography apparatus includes:

receiving a design of the mask and receiving optical properties of the photolithography apparatus.

The method further includes calculating a reference aerial image on a plurality of computing devices on the basis of the design and the optical properties in parallel using a plurality of computing devices and receiving a measured aerial image.

Further, the method includes: comparing the reference aerial image to the measured aerial image and determining a quality of the mask on the basis of the comparison.

Here, the photolithography apparatus can be a system with Köhler illumination.

The measuring apparatus can comprise a sensor which is placed in the image plane of the photolithography apparatus and which is configured to measure a spatial intensity distribution.

The plurality of computing devices can comprise a plurality of processors and/or a plurality of parallel processor units and/or a programmable hardware component. Here, the plurality of computing devices can comprise different memories. By way of example, parallel processor units can have shared access to a shared memory and have further access to a memory assigned to the respective parallel processor unit. Here, the access to the assigned memory can be faster than to the shared memory. In some embodiments, parallel processor units can be realized as graphics processing units, GPUs. The graphics processing units can be in communication with one or more central processing units, CPUs, in a computing device.

Here, the plurality of computing devices can comprise, or be, a parallel computing card.

By way of example, the parallel computing card can be CUDA-capable, as described in the German Wikipedia "CUDA" entry as of 7 May 2019, 19:50 UTC. URL: https://de.wikipedia.org/wfindex.php?title=CUDA&oldid=188338305 (retrieved: 13 May 2019, 12:32 UTC). By way of example, use can be made of CUDA version 9.1.

A reference aerial image is understood to be a simulated aerial image. In general, an aerial image is understood to mean the intensity distribution in the image plane of an optical system. Such reference aerial images simulate the behaviour of photolithographic apparatuses and are known from, e.g., A. Garetto, Th. Scherübl and J. H. Peters, "Aerial imaging technology for photomask qualification: from a microscope to a metrology tool," Adv. Opt. Techn. 2012; 1(4): 289-298.

The measured aerial image comprises a spatial intensity distribution in an image plane of the photolithography apparatus. By way of example, the measured aerial image can be determined using a sensor and, optionally, further optical components directly in the photolithography apparatus. As an alternative or in addition thereto, it can be determined in an apparatus specifically configured to this end, for example in a photomask qualification apparatus such as the Aerial Image Measurement System, AIMS, by Zeiss.

Expressed differently, the measured aerial image can be measured using a measuring apparatus in the photolithography apparatus and/or in an external apparatus such as a photomask qualification apparatus.

In cases where the measurement is implemented in the photolithography apparatus and in the photomask qualification apparatus, either work can be carried out using one measuring apparatus or information from different measuring apparatuses can be combined. In such cases, the measuring apparatus can comprise a first measuring apparatus and a second measuring apparatus.

The method can be advantageous in that the processing is accelerated by the plurality of computing devices.

The parallel calculation of the reference aerial image is implemented on the basis of the pupil-shift method, the pupil-shift method being able to be implemented for a parallel calculation with the plurality of computing devices.

The pupil-shift method is sometimes also referred to as Hopkins method and is known in its own right, for example from Kenji Yamazoe: "Computation theory of partially coherent imaging by stacked pupil shift matrix," J. Opt. Soc. Am. A, (12):3111-3119, December 2008, Kenji Yamazoe: "Two models for partially coherent imaging," J. Opt. Soc. Am., A, 29(12):2591-2597, December 2012 and H. Kirchauer, "Photolithography Simulation," Technische Universität Wien: Dissertationen der Technischen Universität Wien, Österreichischer Kunst-und Kulturverl., 2000. The pupil-shift method or the actual shift of the coordinates in the double integral is sometimes also referred to as a circular shift.

Here, parallel calculation can comprise subdividing the reference aerial image to be calculated into blocks, with the individual blocks respectively being calculated in parallel.

Here, the pupil-shift method can use a common intensity function, a mask transmission function and a discrete pupil function or use equivalent or reduced representations of these functions, as explained below using the example of the transmission cross coefficient matrix.

The common intensity function describes the illumination of the object.

The common intensity function is sometimes denoted "J". The common intensity function is sometimes also referred to as intensity function or as common intensity distribution function.

The discrete pupil function describes a complex scalar amplitude distribution function of the image of the photolithography apparatus. The discrete pupil function is sometimes denoted "K". Sometimes, the discrete pupil function is also referred to as pupil function.

The mask transmission function is a two-dimensional complex field from which a spatially dependent transmission of the mask can be determined by means of a Fourier transform, wherein the transmission of the mask is specified for a two-dimensional mask. The local transmission of the mask can be specified as a real transmission characteristic and/or as a complex transmission characteristic in the case of phase-changing masks. The transmission of the mask is sometimes denoted "t"; the mask transmission function is sometimes denoted "T". The mask transmission function can be described by mask transmission coefficients $t_k$, as explained in more detail below.

Here, the discrete pupil function can be determined on the basis of at least one measurement by the measuring apparatus.

By way of example, the discrete pupil function can be determined in one or more image planes by way of a calibration measurement. Here, the discrete pupil function can be determined independently of a mask and/or a mask transmission function.

The mask transmission coefficients $t_k$ can likewise be determined by way of an independent calibration measurement for the relevant mask.

This can simplify the interpretation of the reference aerial image since fewer assumptions have to be made about the input parameters of the simulation.

The discrete pupil function and the common intensity function can be represented by a transmission cross coefficient matrix, TCC matrix.

Here, the TCC matrix can be determined according to Equation (2.7), as described below. In some embodiments, J can be assumed to be constant and/or known.

This can be advantageous in that the memory requirement of the plurality of computing devices overall or of the associated memories can be reduced or the number of times that the memory or the associated memory is accessed can be reduced.

The method can furthermore include:
determining a plurality of eigenvalues of the transmission cross coefficient matrix,
selecting a set of eigenvalues from the plurality of eigenvalues, the cardinality of the set of eigenvalues being smaller than the cardinality of the plurality of eigenvalues, and
carrying out the method with the set of eigenvalues.

The cardinality of the set of eigenvalues can be smaller by a factor a than a number of light source points used.

Here, light source points are punctiform light sources in the two-dimensional illumination plane. These can shine on the mask with a certain intensity and at a certain angle. The angle can be dependent on the position of the point on the pupil plane. Light source points can also be embodied as a point light source, i.e., have an intensity distribution that is independent of angles.

Light source points are sometimes denoted by the symbol "L". Here, L can comprise the coordinates and/or intensity distribution of light source points, for example represented by the angle of incidence. The light from a plurality of such light source points can be described by the common intensity function, as described above, sometimes denoted by the symbol "J".

Here, the following may hold true: a>5, for example a>10, for example a>15, for example a>20, for example a>25, for example a>30.

As an alternative or in addition thereto, between 50 and 1000 eigenvalues, in particular between 100 and 500 eigenvalues, can be used to describe a mask.

Such procedures for reducing the number of eigenvalues used may be advantageous in that the memory requirement of the plurality of computing devices overall or of the associated memories can be reduced and/or the number of accesses to the memory or the associated memory can be reduced and/or the calculation duration can be reduced.

The method can include:
  representing the design of the mask by a set of k polygons,
  carrying out an analytic spectrum calculation for the set of k polygons, and
  determining the mask transmission function on the basis of the analytical spectrum calculation for polygons using a Fourier transform.

Here, the polygons can be chosen as desired.

The design of the mask can be a mask transmission in real space in this case, sometimes denoted as t(x, y).

Here, an analytic spectrum calculation is understood to mean determination of the mask transmission function T on the basis of the mask transmission in real space by way of a Fourier transform. Here, the mask transmission function is defined in frequency space and therefore sometimes also referred to as mask spectrum or mask spectral function. If the mask transmission is described by triangles, the Fourier transform can be carried out for individual triangles. This will be explained in more detail later.

The polygons can be triangles. In such cases, the method can include:
  representing the design of the mask by a set of k triangles,
  carrying out an analytic spectrum calculation for the set of k triangles, and
  determining the mask transmission function on the basis of the analytical spectrum calculation using a Fourier transform.

One possible procedure for the analytical spectrum calculation of triangles is known in its own right from H. Kirchauer, Photolithography Simulation, Technische Universität Wien: Dissertationen der Technischen Universität Wien. Österreichischer Kunst-und Kulturverl., 2000, cf. B.1. Here, the equations have case differentiation. This may require so-called branching in implementations of these calculations.

Usually, such branching in equations is considered disadvantageous for parallelized calculation methods. However, using such a procedure may be advantageous in that such branching has no bottleneck-type behaviour in some implementations, for example by means of CUDA methods. This will be explained in more detail later.

A general method for polygons is described below. This method can be applied in addition or as an alternative to the above-described method for triangles. It can also be used for polygons with a greater number of corners. By way of example, the considered polygon can be a quadrilateral, pentagon, hexagon, heptagon or octagon. However, greater numbers of corners are also possible.

The following labels are chosen for the method:

Provided nothing else is specified, the index k=0, 1, 2, . . . , N−1 (cyclically mod N) denotes the index of the corners of the polygon.

By way of example, k runs from 0 to 2 in the case of a triangle and from 0 to 4 in the case of a pentagon.

Here, "cyclically mod N" means, for example, $p_N$=p0, $p_{N+1}$=p1, etc.

The respective corners are denoted by the vector $p_k$, where k is the previously described index.

The edges can be parameterized according to $$[p_k, p_{k+1}] = \{(1-t)p_{k+1}p_{k+1} : 0 \leq t \leq 1\}.$$

The vectors of the edge centre points can be denoted by $$m_k = \frac{p_{k+1} + p_k}{2}.$$

The half edge vectors are denoted by $$t_k = \frac{p_{k+1} - p_k}{2}.$$

The outwardly directed unit normal vectors of the edges are denoted by $\hat{n}_k$.

The (scaled) normal vectors of the edges can be given by:

$$n_k = |p_{k+1} - p_k| \hat{n}_k$$

Using the aforementioned conventions, the spectrum of the polygon can be calculated analytically as follows:

The gradient of the indicator function $\mathbb{1}P$ is given by $$\nabla \mathbb{1}p = \sum_k \hat{n}_k \delta_{[p_k, p_{k+1}]}$$

and has the Fourier transform $$i\omega \hat{\mathbb{1}} p(\omega) = \sum_k \hat{n}_k \int_{[p_k, p_{k+1}]} e^{-i\omega r} dr.$$

Then, the following arises for the integral over the edge:

$$\frac{1}{[p_{k+1} - p_k]} \int_{[p_k, p_{k+1}]} e^{-i\omega r} dr =$$

$$\int_0^1 e^{i\omega((1-t)p_k + tp_{k+1})} dt = \left[ \frac{e^{-i\omega((1-t)p_k + tp_{k+1})}}{-i\omega(p_{k+1} - p_k)} \right]_0^1 = \frac{e^{-i\omega p_{k+1}} - e^{-i\omega p_k}}{-i\omega(p_{k+1} - p_k)}$$

Consequently, the following applies:

$$\omega^2 \hat{\mathbb{1}} p(\omega) = \sum_k \frac{\omega n_k}{\omega t_k} \left( e^{-i\omega p_{k+1}} - e^{-i\omega p_k} \right). \quad (1)$$

If the angle between the k-th edge and the frequency vector is denoted by $\theta_k$ such that the following applies:

$$\sin \theta_k = \hat{\omega} \hat{n}_k$$

$$\cos \theta_k = \hat{\omega} \hat{t}_k,$$

then the following applies:

$$\hat{\mathbb{1}} p(\omega) = \frac{1}{\omega^2} \sum_k \tan \theta_k \left( e^{-i\omega p_{k+1}} - e^{-i\omega p_k} \right) \quad (2)$$

$$= \frac{1}{\omega^2} \sum_k (\tan \theta_{k-1} - \tan \theta_k) e^{-i\omega p_k}. \quad (3)$$

The edge integral can also be written as:

$$\frac{1}{[p_{k+1}+p_k]}\int_{[p_k,p_{k+1}]} e^{-i\omega r}dr = -e^{-i\omega\frac{p_{k+1}+p_k}{2}}\frac{e^{+i\omega\frac{p_{k+1}-p_k}{2}}-e^{-i\omega\frac{p_{k+1}-p_k}{2}}}{2i\omega\frac{p_{k+1}-p_k}{2}},$$

Taking account of the convention that $$\operatorname{sinc}(x) := \frac{\sin x}{x}$$

the following applies:

$$\hat{1}p(\omega) = -\frac{1}{\omega^2}\sum_k \omega n_k e^{-i\omega m_k}\operatorname{sinc}\,\omega t_k \quad (4)$$

The method can furthermore include:
calculating a plurality of reference aerial images for an associated plurality of focusing settings, FE, of the lithography apparatus, with the transmission cross coefficient matrix been kept constant in each case. The calculation of the plurality of reference aerial images can further include: determining a plurality of discrete pupil functions, K(FE).

Here, each discrete pupil function K(FE) is a discrete pupil function K of the pupil-shift method, as described above, with the differences in the respective discrete pupil function K(FE) being determined by the respective focusing setting FE of the lithography apparatus described thereby. Alternatively, K(FE) can also be denoted by $K_Z$. The intensity distribution of the aerial image belonging to the respective focusing setting can be denoted by $I_Z$. In some embodiments, an associated focal plane in the imaging system, for example in the photolithography apparatus, can be assigned to a focusing setting.

Here, each discrete pupil function of the plurality of discrete pupil functions can be respectively assigned to a focusing setting of the plurality of focusing settings. Further, one of the aforementioned methods can respectively carry out the plurality of discrete pupil functions.

Here, the method can further include: representing each of the discrete pupil functions of the plurality of discrete pupil functions, respectively as a matrix; loading the plurality of discrete pupil functions into an associated memory; and calculating the plurality of reference aerial images without downloading matrices into the associated memory.

Such procedures may have the advantage that there are no time losses on account of downloading information from the shared memory to the associated memory. As a result of this, the quicker access times of the associated memories in such apparatuses can be used effectively.

Here, the pupil-shift method can comprise one or more multiplications of matrices. Here, at least one of the multiplications of matrices can be carried out by means of scalar multiplication.

This may be advantageous in that scalar multiplications can be carried out in a particularly time-efficient manner for parallel calculations on some hardware components, and so the method can be carried out more quickly.

The method can be carried out using single precision floating point values in the plurality of computing devices. Here, the values can be represented by floating point numbers; the method can comprise the use of floating point arithmetic.

This can be advantageous in that the calculations can be carried out in accelerated fashion, for example in relation to calculations using double precision values, but a sufficiently accurate result can nevertheless be obtained.

What can be exploited here is that some computing devices, for example GPUs, can handle single precision floating point arithmetic more efficiently. In image simulations, as described here, single precision can have the advantage that the amount of memory required can be halved in comparison with double precision.

As an alternative or in addition thereto, single precision can be used in the analytical spectrum calculation. This may be advantageous in that computing devices of the plurality of computing devices, for example the GPUs, for example MSPs of one or more GPUs, can be loaded more evenly since the calculation with single precision requires significantly less computation time on the computing devices than double precision. This may bring about an additional speed advantage since the spectrum calculation relies on a plurality of trigonometric calculations, for example sine and cosine functions, as described above and below.

A computer program with program code is provided. The program code causes one of the methods to be carried out when the program code runs in parallel on a plurality of processors and/or a plurality of parallel processor units and/or a programmable hardware component.

An apparatus for mask characterization is provided. The latter comprises at least one computing apparatus. The computing apparatus comprises a plurality of computing devices, the plurality of parallel processor units being configured to carry out one of the methods.

The apparatus further comprises a measuring apparatus. The measuring apparatus is configured to determine the measured aerial image and provide the latter for the computing apparatus.

The measuring apparatus can be disposed in a photolithography apparatus and/or in a photomask qualification apparatus.

In cases where the measurement is implemented in the photolithography apparatus and in the photomask qualification apparatus, either work can be carried out using one measuring apparatus or information from different measuring apparatuses can be combined. In such cases, the measuring apparatus can comprise a first measuring apparatus and a second measuring apparatus.

The measured aerial image can be determined using a sensor which measures a spatial intensity distribution in the image plane.

Here, the measuring apparatus can comprise a sensor. The sensor can be introduced into an imaging plane. In addition or as an alternative thereto, the apparatus for mask characterization may comprise a variable beam path, the variable beam path imaging the light into an image plane in a first configuration and imaging the light onto a sensor in a second configuration, said sensor not being situated in the image plane of the first configuration.

BRIEF DESCRIPTION OF DRAWINGS

FIG. 8C shows a pseudo-code for a possible procedure for parallel calculation of an aerial image.

FIG. 9 shows a kernel which implements a scalar matrix multiplication as per Equation (2.6).

FIG. 10 shows a possible implementation of the kernel which accumulates the output of the fast Fourier transform to form the reference image.

DETAILED DESCRIPTION

The properties, features and advantages of this invention described above and the way in which they are achieved will become clearer and more clearly understood in association with the following description of the embodiments which are explained in greater detail in association with the drawings.

Below, embodiments are described in more detail with reference to the drawings. In the figures, identical reference signs denote identical or similar elements. The figures are schematic representations of various embodiments. Elements illustrated in the figures are not necessarily illustrated as true to scale. Rather, the various elements illustrated in the figures are rendered in such a way that their function and general purpose become comprehensible to the person skilled in the art. Connections and couplings between functional units and elements as illustrated in the figures can also be implemented as an indirect connection or coupling. A connection or coupling can be implemented in a wired or wireless manner. Functional units can be implemented as hardware, software or a combination of hardware and software.

In conjunction with FIG. 1 and FIG. 2, apparatuses and methods are explained below in the context of photolithography. In so doing, the specific application requirements are described in more detail.

Figure 3:
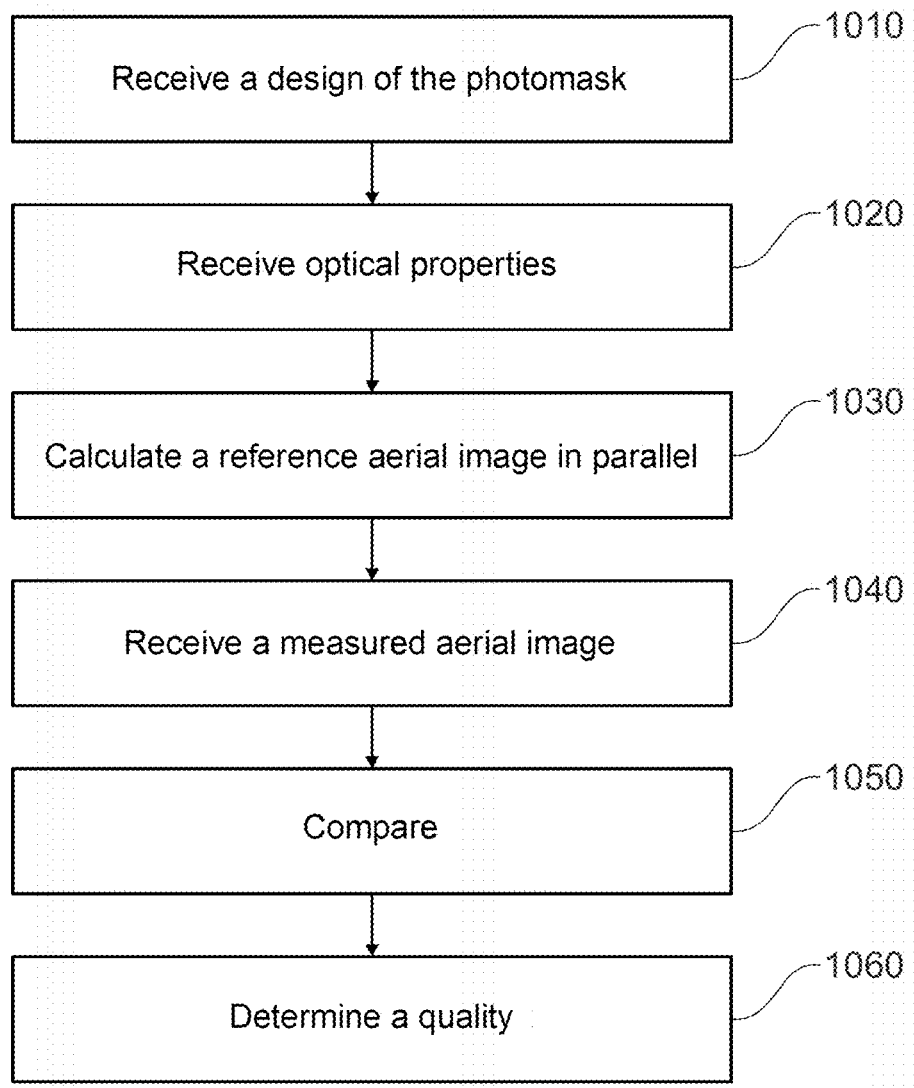
FIG. 3 shows an embodiment of a method.
Figure 4:
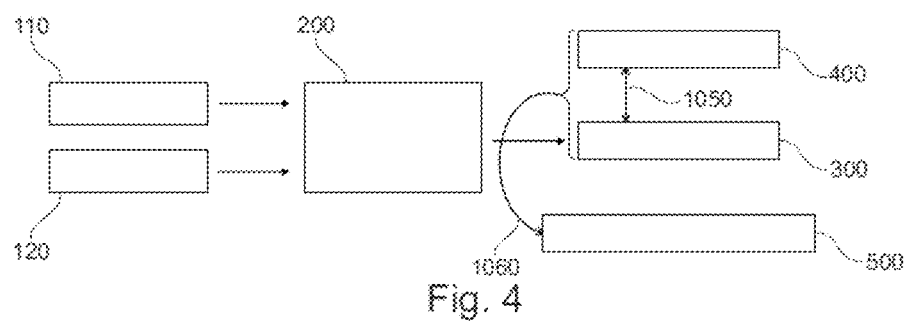
FIG. 4 shows an embodiment of a method.

In conjunction with FIGS. 3 and 4, various embodiments for methods are explained.

In conjunction with FIGS. 5 to 7, various embodiments for implementing parallel calculations are discussed below, inter alia in the context of parallel calculations by means of graphics processing units.

Subsequently, possible advantages of parallelized procedures are discussed in conjunction with FIGS. 1A and 11B to FIGS. 13A and 13B.

Figure 1:
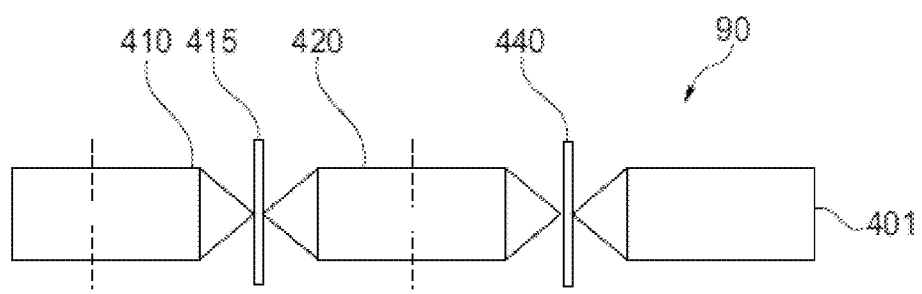
FIG. 1 schematically shows a photolithography apparatus.

FIG. 1 schematically shows an example of a photolithography apparatus 90. The photolithography apparatus 90 comprises the following components: An illumination, for example implemented by an illumination component 410, an object plane 415, imaging part 420 and an image plane 440. By way of example, there can be imaging on a wafer 401 in the image plane 440 for the purposes of photolithography.

Figure 2:
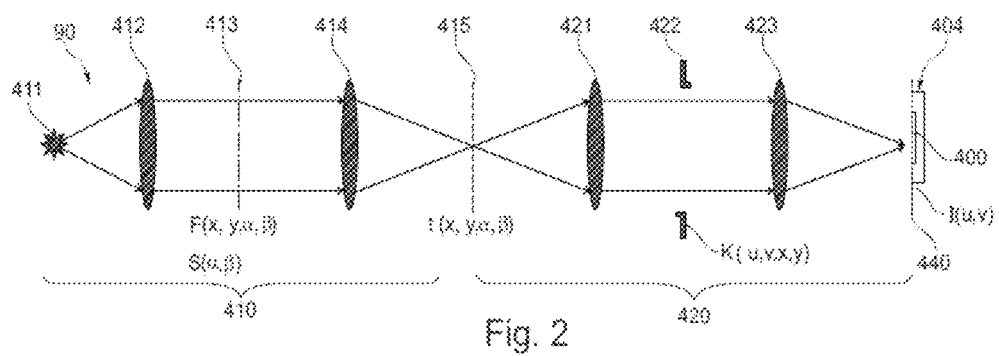
FIG. 2 shows a schematic design of a photolithography apparatus and a possible model for describing the photolithography apparatus.

FIG. 2 shows a detailed schematic design of an example of the photolithography apparatus 90 with Köhler illumination and the mathematical assumptions for describing the photolithography apparatus 90. Here, the illumination component 410 comprises a light source 411, which can be assumed to be a set of point light sources, for example, a collimating optical unit 412, an illumination plane 413 and a focusing lens element 414. Here, the illumination plane 413 is sometimes also referred to as illumination pupil plane or pupil plane. The focusing lens element 414 focuses the light into the object plane 415. The imaging part 420 is likewise composed of two lens elements 421, 423. Here, the imaging part 420 can comprise an image stop 422. The imaging part 420 images the object plane 415 onto the image plane 440. A mask can be placed in the object plane 415 in order to generate an image in the image plane 440. In a first mode of operation, a sensor 404 can be disposed in the image plane 440 in order to obtain a measured aerial image 400 of the photolithography apparatus 90 on the basis of the mask in the image plane 415. In a second mode of operation, a wafer, for example the wafer 401 of FIG. 1, can be disposed in the image plane 440. Here, the first mode of operation can be used for the purposes of photolithography apparatus diagnostics and the second mode of operation can be used to write on the wafer in photolithographic fashion. In other embodiments, provision can also be made of an independent apparatus, which only provides the second mode of operation. Two independent apparatuses are used in such cases. Here, the sensor 404 can be used in only one apparatus or in both apparatuses. As an alternative or in addition thereto, different sensors could be used, for example respectively one sensor per independent apparatus.

Here, the following designations can be used:

S can be a real scalar function, which describes the intensity of the light source, for example as a function of the coordinates in the illumination plane 413, for example in the form of light source points.

F can be a complex scalar amplitude distribution function of the illumination component 410.

J can denote the common intensity function which illuminates the object.

t can be a complex scalar function which describes the amplitude of the transmittance, for example the transmission characteristic of the object, for example of the mask.

T can describe the spectrum of the object in frequency space, for example be the Fourier transform of t. T can also be referred to as mask transmission function.

K can denote the complex scalar amplitude distribution function of the imaging 420. K can be referred to as discrete pupil function.

I can denote the intensity distribution in the image plane 440. I can denote the reference aerial image, for example represented as I(u, v).

Possible implementations of S, F, J and K are described in, for example:

Konstantinos Adam. Domain Decomposition Methods for the Electromagnetic Simulation of Scattering from Three-Dimensional Structures with Applications in Lithography. PhD thesis, EECS Department, University of California, Berkeley, 2001, H. Kirchauer, Photolithography Simulation, Technische Universität Wien: Dissertationen der Technischen Universität Wien. Österreichischer Kunst-und Kulturverl., 2000, Bahaa E. A. Saleh and Malvin Carl Teich. Fundamentals of Photonics, Wiley, New York, 1991 and Herbert Gross, Wolfgang Singer, and Totzeck Michael. Handbook of Optical Systems—Volume 2: Physical Image Formation. Wiley-VCH Verlag GmbH & Co. KGaA, New York, 2005.

Using numerous simplifying assumptions, in particular that the light source 411 is a point light source or a plurality of point light sources and that the mask in the object plane 415 can be approximated as infinitely thin, the light behaviour can be described locally two-dimensionally in the space variables x, y or, on the imaging side, in the space variables u, v and also as a function of the spatial coordinates $\alpha$, $\beta$ of the light source 411.

This facilitates a significant simplification of the description in relation to a complete description by means of electromagnetic optics and/or wave optics. As a characteristic feature of the Köhler illumination, the light strikes the object plane 415 as plane waves. Consequently, in order to describe the behaviour of light in the illumination component 410 sufficiently accurately, the function $F(x, y, \alpha, \beta)$ can be used, where the function $S(\alpha, \beta)$ can describe the intensity of the light source, for example as a function of the coordinates in the illumination plane 413, for example in the form of light source points. Here, $S(\alpha, \beta)$ can be described, in particular, by a superposition of a plurality of light source points, which are located in the illumination plane 413.

The image of a mask with transmission characteristic $t(x, y, \alpha, \beta)$ as a function of the spatial coordinates x and y and the local coordinates $\alpha$, $\beta$ by the imaging 420 can be described accordingly by a discrete pupil function $K(u, y, x, y)$, where x, y, u and v are defined as above. As a result, it is possible to calculate an intensity distribution $I(u, v)$ in the image plane 440. This intensity distribution $I(u, v)$ can describe the reference aerial image.

The measuring apparatus can comprise a sensor which is placed in the image plane of the photolithography apparatus and which is configured to measure a spatial intensity distribution.

By way of example, this is described in more detail in the aforementioned sources by Yamazoe and Kirchauer. This can already significantly reduce the computational outlay in relation to full electromagnetic simulations and/or complete wave-optical simulations of the light propagation.

FIG. 3 shows an embodiment of a method 1000. The method 1000 is explained in conjunction with FIGS. 3 and 4.

At 1010, the method 1000 includes receiving a design of a mask. The design of the mask can be the design of the mask 110 of FIG. 4.

At 1020, the method includes receiving optical properties. The optical properties can be the optical properties 120 of FIG. 4 and can comprise optical properties of the photolithography apparatus 90 of FIGS. 1 and 2. By way of example, the optical properties can be described according to the pupil-shift method, as explained above and below.

At 1030, there is a parallel calculation, using a plurality of computing devices, of a reference aerial image 300 on the basis of the design of the mask 110 and the optical properties 120. Here, the design of the mask 110 can be described on the basis of triangles, as explained above and below.

At 1040, a measured aerial image 400 is received. The measured aerial image could have been measured using a measuring apparatus in the photolithography apparatus. By way of example, the measured aerial image 400 could have been determined by placing a sensor 404 in the image plane 440.

At 1050, the reference aerial image 200 is compared to the measured aerial image 400.

The comparison could comprise a comparison of the intensity values $I(u, v)$ of the reference aerial image with the measured spatial intensity values of the measured aerial image. The comparison of the intensity values can be implemented pixel-by-pixel if the respective coordinates of the reference aerial image and of the measured aerial image correspond to one another, for example because the coordinates of the reference aerial image were chosen in accordance with the coordinates of the measured aerial image prior to the calculation. Additionally, one or more coordinate transformations could be performed in other embodiments, for example coordinate transformations of the reference aerial image and/or the measured aerial image, in order to facilitate an accurate comparison.

Numerous options are available for quantifying the comparison between the reference aerial image and the measured aerial image, which are known in their own right for the purposes of image comparisons. By way of example, a pixel-to-pixel difference can be considered or feature-based differences can be considered. Here, quantification can be implemented by way of a number (for example corresponding to a square deviation) or by way of a plurality of numbers, for example different numbers for different features or different regions of reference aerial image and measured aerial image.

At 1060, a quality of the mask 500 is determined on the basis of the comparison at 1050.

Here, the quality of the mask can be determined on the basis of the quantification of the comparison. By way of example, the quality of the mask can be determined by a preselected threshold in this case and can be a binary decision, for example "mask in order" and "mask not in order." In other embodiments, the quality of the mask can be quantified as a number, for example a quality number between 100% for perfect correspondence and 0% for complete non-correspondence. In yet further embodiments, the quality of the mask can be described by a plurality of numbers and/or parameters, for example as "intensity correspondence 99.5%, quality of the conductor track structures—very good, quality of transistor structures: unacceptable."

The quality can then be assessed on the basis of minimum requirements; by way of example, in the preceding example, the quality of the mask can be assessed as "not in order" if the quality of the transistor structures is unacceptable. Then, in the process, the intensity correspondence of 99.5% can in particular remain unconsidered. Expressed differently, a single local fault can be used to assess the quality.

The parallel calculation, as explained at step 1030 in FIG. 3, can be implemented on the basis of the pupil-shift method. Here, the pupil-shift method can be implemented for a parallel calculation with the plurality of computing devices.

Here, the reference aerial image 300 can be calculated in the image plane 400 by virtue of the simplifying assumptions of the pupil-shift method being advantageously applied. In some embodiments, the pupil-shift method can be carried out on the basis of a common intensity function J, a mask transmission function T and a discrete pupil function K. In further embodiments, the common intensity function and the mask transmission function can be represented by a transmission cross coefficient matrix, TCC matrix.

Then, the intensity I(u, v) of the reference aerial image can be described by $$I(u, v) = \left| \int\int_{-\infty}^{\infty} K(u, v, x, y)\, t(x, y)\, J(x, y)\, dx\, dy \right|^2 \quad (2.1)$$

beschrieben warden. An approximation used here is that the amplitude of the mask transmission t(x, y) is independent of the light source S(α, β). On account of this assumption, it is possible to describe the mask as the mask transmission function T as a two-dimensional complex field, which can be determined as follows by the Fourier transform of the mask transmission t(x, y):

$$T(n, m) = \frac{M^2}{ab} \int_0^a \int_0^b t(x, y) e^{-j2\pi(nxM/a + myM/b)} dx\, dy \quad (2.2b)$$

Accordingly, the inverse transformation is given by:

$$t(x, y) = \int_0^{a/M} \int_0^{b/M} T(n, m) e^{j2\pi(nxM/a + myM/b)} dn\, dm \quad (2.2)$$

Here, a/M and b/M are respectively the object periods, and so a and b are the image periods in the x- and y-direction for a projection system with a magnification M=1.

A further assumption made here is that the mask is periodic both in the x-direction and in the y-direction, and so the following applies:

$$t(x+a/M, y+b/M) = t(x,y) \quad (2.3)$$

As a result of the Fourier transform of Equation (2.2), the convolution can be written as a multiplication in frequency space, which is shifted in accordance with the illumination direction of J. Consequently, Equation 2.2 can be written as:

$$I(u, v) = \int\int_{-\infty}^{\infty} J(p, q) \quad (2.4)$$

$$\left| \int_0^{a/M} \int_0^{b/M} T(n, m) K(n, m) e^{j2\pi((n-p)u/a + (m-q)v/b)} dn\, dm \right|^2 dp\, dq$$

If the shift is now carried out in the discrete pupil function K, the equation, referred to as a pupil-shift method, for the intensity distribution I(u, v) of the aerial image is obtained:

$$I(u, v) = \int\int_{-\infty}^{\infty} J(p, q) \quad (2.5)$$

$$\left| \int_0^{a/M} \int_0^{b/M} T(n, m) K(n-p, m-q) e^{j2\pi(nu/a + mv/b)} dn\, dm \right|^2 dp\, dq$$

Alternatively, it is possible to shift T in place of K. This is referred to as spectral shift method:

$$I(u, v) = \int\int_{-\infty}^{\infty} J(p, q) \quad (2.6)$$

$$\left| \int_0^{a/M} \int_0^{b/M} T(n-p, m-q) K(n, m) e^{j2\pi(nu/a + mv/b)} dn\, dm \right|^2 dp\, dq$$

For an effective calculation, it is possible to perform an eigenfunction analysis, as described in Kenji Yamazoe, "Two models for partially coherent imaging," J. Opt. Soc. Am., A, 29(12): 2591-2597, December 2012. This is referred to as the transmission cross coefficient matrix approach, TCC approach. In this case, rewriting Equation 2.5 yields:

$$I(u,v) = \iiiint TCC(x_1, y_1, x_2, y_2) T(x_1, y_1) e^{j2\pi((x_1-x_2)u + (y_1-y_2)v)}$$
$$(dx_1 dx_2 dy_1 dy_2 TCC(x_1, y_1, x_2, y_2) = \iint J(f, g) K(f+x_1, g+y_1) K^*(f+x_2, g+y_2) df\, dg \quad (2.7)$$

Here, the transmission cross coefficient matrix TCC contains the optical settings of the lithography apparatus and can be calculated in advance for static optical settings. The transmission cross coefficient matrix can be diagonalized by means of its eigenvalues $\mu_j$ and eigenfunctions $\Phi_j$.

If the TCC is assumed to be a Hermitian matrix, the eigenvalue and eigenfunction problem can be formulated as follows:

$$I(u, v) = \sum_{j=1}^{E} \mu_j \left| \int\int T(n, m) \phi_j(n, m) e^{j2\pi(nu+mv)} dn\, dm \right|^2 \quad (2.8)$$

What can be exploited by the representation as a sum of eigenvalues is that—in the case of an appropriate sort of the representation according to magnitude of the eigenvalues—the contribution of the individual terms of the sum to the reference aerial image reduces. This can reduce the number of Fourier transforms that are required to sufficiently precisely calculate the reference aerial image I(u, v). In particular, E≤N can be assumed for a number of N light source points.

Since the Fourier transforms contribute a large contribution to the required runtime, the reduction in the required Fourier transforms can lead to a significant acceleration of the method. What can be exploited here is that the TCC matrix can be diagonalized by means of eigenfunctions and eigenvalues as a positive definite Hermitian matrix, as described above. This can be carried out, for example a single time, in external programs, e.g., in MATLAB. Such a procedure can be advantageous when the optical settings described by the TCC matrix remain constant.

Figures 12A, 12B:
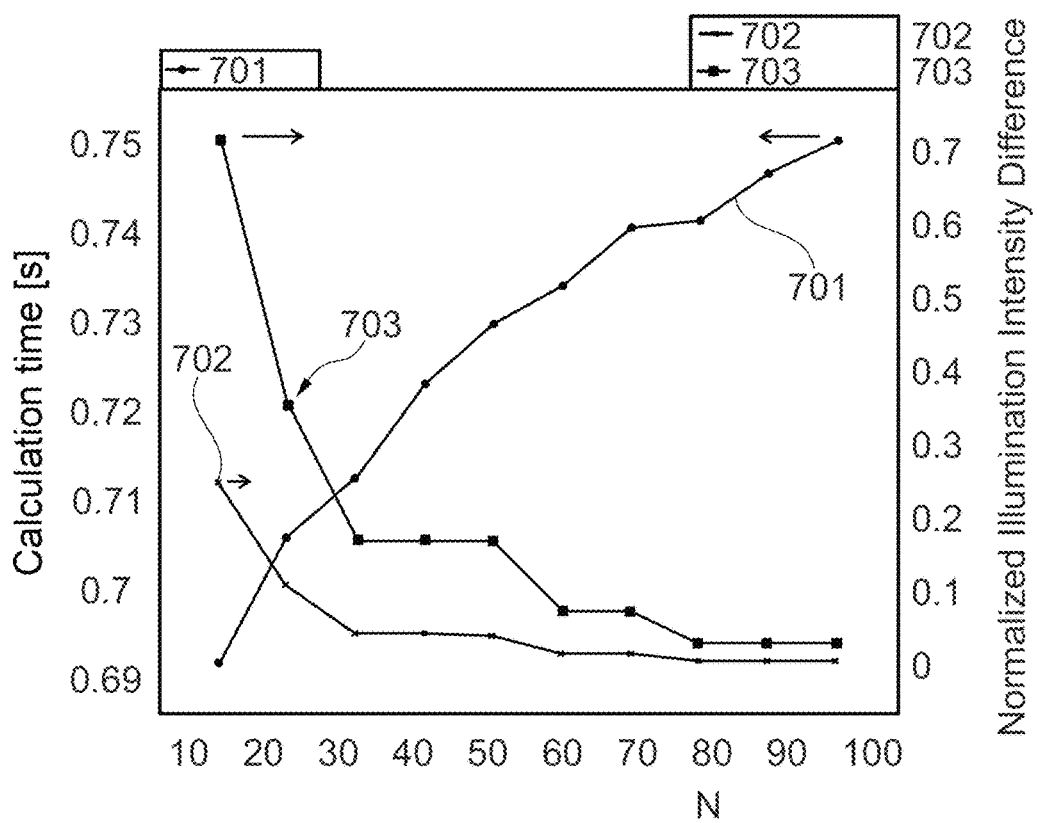
FIG. 12A and FIG. 12B show quality of the parallelized calculations as per various embodiments.

Here, the TCC matrix can be approximated in diagonalized fashion. By way of example, use could be made only of the largest eigenvalues in terms of magnitude and the remaining eigenvalues could be set to zero. This can further accelerate the calculation. This will be explained in more detail below. Results relating to the influence of the eigenvalue selection on the precision and runtime are shown in FIGS. 12A and 12B.

In some embodiments, the mask transmission function T is determined from design data. As described in Equation (2.2b), the mask transmission function T is the Fourier transform of the mask transmission t(x, y). In accordance with the method described in H. Kirchauer, Photolithography Simulation, Technische Universität Wien: Dissertationen der Technischen Universität Wien. Österreichischer Kunst-und Kulturverl., 2000, the mask transmission at any point can be represented as follows:

Here, the index k used below in the description in conjunction with Formulae (2.9) to (2.19) is an index for patterns and differs from the previously used index for corners of the polygon.

$$t(x, y) = \sum_{k} t_k PAT_k(x, y) \qquad (2.9)$$

where $$PAT_k(x, y) = \begin{cases} 1 & \text{if } (x, y) \text{ is within the pattern } k \\ 0 & \text{otherwise} \end{cases} \qquad (2.10)$$

applies. Here, $PAT_k(x, y)$ describes any elemental pattern of the mask. The transmission coefficient $t_k$ in Equation (2.9) is given by:

$$t_k \begin{cases} \equiv 1 & \text{for binary masks} \\ \in \mathbb{C} & \text{for phase-shifting masks} \end{cases} \qquad (2.11)$$

If a and b denote the width and height of the mask, then, for 1:1 imaging, T can be described by:

$$T(n, m) = \frac{1}{ab}\int_0^a \int_0^b t(x, y) e^{-j2\pi(nx/a + my/b)} \, dy \, dx \qquad (2.12)$$

By inserting Equations (2.9), (2.10) and (2.11) into Equation (2.12), the following is obtained:

$$T(n, m) = \sum_k t_k \left[ \frac{1}{ab} \int_0^a \int_0^b PAT_k(x, y) e^{-j2\pi(nx/a + my/b)} \, dy \, dx \right] \qquad (2.13)$$

Here, the expression in square brackets denotes the elemental pattern spectrum $P_k(n, m)$:

$$T(n, m) = \sum_k t_k P_k(n, m) \qquad (2.14)$$

For any given triangle k, which consists of the associated three points $$\{(x_{k1}, y_{k1}), (x_{k2}, y_{k2}), (x_{k3}, y_{k3})\} \in \mathbb{R}^2,$$

this can be calculated analytically according to:

$$P_k(n, m) = \frac{|\det A|}{ab} e^{-j2\pi c_{nm}} W(a_{nm}, b_{nm}) \qquad (2.15)$$

$$W(a_{nm}, b_{nm}) = \int_0^1 \int_0^{1-\xi} e^{-j2\pi(a_{nm}\xi + b_{nm}\eta)} d\eta \, d\xi \qquad (2.16)$$

where $$A = \begin{pmatrix} x_{k2} - x_{k1} & x_{k3} - x_{k1} \\ y_{k2} - y_{k1} & y_{k3} - y_{k1} \end{pmatrix} \qquad (2.17)$$

denotes the transformation matrix which converts any triangle into the unit triangle $\{(0,0), (1,0), (0,1)\}$.

Here, the coefficients $a_{nm}$, $b_{nm}$ and $c_{nm}$ are given by:

$$a_{nm} = \frac{n(x_{k2} - x_{k1})}{a} + \frac{m(y_{k2} - y_{k1})}{b} \qquad (2.18)$$

$$b_{nm} = \frac{n(x_{k3} - x_{k1})}{a} + \frac{m(y_{k3} - y_{k1})}{b}$$

$$c_{nm} = \frac{nx_{k1}}{a} + \partial_{my_{k1}} b$$

By considering limit values and by a transformation to unit triangles, the integral of equation 2.16 can be rewritten as:

(2.19)

$$W(a_{nm}, b_{nm}) =$$

$$\begin{cases} \dfrac{1}{2} & \text{if } a_{nm} = b_{nm} = 0 \\[2mm] \dfrac{j}{2\pi a_{nm}} \left( e^{-j2\pi a_{nm}} - \operatorname{sinc}(\pi a_{nm}) e^{-j\pi a_{nm}} \right) & \text{if } a_{nm} = b_{nm} \neq 0 \\[2mm] \dfrac{j}{2\pi} \left( \dfrac{\operatorname{sinc}(\pi a_{nm})}{a_{nm} - b_{nm}} e^{-j\pi a_{nm}} + \dfrac{\operatorname{sinc}(\pi b_{nm})}{b_{nm} - a_{nm}} e^{-j\pi b_{nm}} \right) & \text{otherwise} \end{cases}$$

The points of triangles which represent the mask can be provided, for example, as a three-dimensional real double precision float array.

The transmittance of respective triangles can be provided in a one-dimensional complex real double precision float array.

Grids of spectral coordinates in the x- and y-direction can each be provided as a one-dimensional real double precision float array.

The size of the reference aerial image in pixels in the x- and y-direction can each be provided in the form of real double precision floating point numbers.

However, other ways of providing the values are also possible.

Such procedures can accelerate the parallel calculation 1030 of the reference aerial image 300 using a plurality of computing devices. This is described in more detail below.

In some embodiments, some of the required coefficients of the transformation matrix A of Equation (2.17) may be constant. Further, the transmittance coefficient of the triangle, for example the transmission coefficient ti, can be constant.

In order to be able to effectively divide these constant coefficients during the parallel calculation, for example between individual threads, a grid can be chosen in such a way that each block calculates one triangle. In such embodiments, all threads of this block can calculate the contribution of the respective triangle for all spectral coordinates. Finally, this intermediate result obtained thus can be added to a global spectrum, for example for all triangles together. Then, this allows T to be determined.

Here, it may be disadvantageous if different blocks simultaneously access the same spectral coordinates. Therefore, it may be necessary to carry out atomic addition in this case, for example by means of an atomic library, for example by means of the atomic CUDA functionalities.

As an alternative or in addition thereto, the calculation of trigonometric functions in the expression $W(a_{nm}, b_{nm})$ can be simplified, as described below.

The expression $$\sin(\pi x) e^{-j\pi x}$$

can be simplified as:

$$\operatorname{sinc}(\pi x)e^{-j\pi z} = \begin{cases} 1 & \text{if } |\pi x| \leq 10^{-6} \\ \dfrac{\cos(\pi x)\sin(\pi x) - j\sin^2(\pi x)}{\pi x} & \text{otherwise} \end{cases} \quad (4.1)$$

Here, the arguments which are passed to sine and cosine are positive. The term $-\pi x$, which is passed to $e^{-j}$, can be eliminated using the trigonometric identity:

$$\cos(-\pi x)+j\sin(-\pi x)=\cos(\pi x)-j\sin(\pi z) \quad (4.2)$$

Likewise, the term $e^{-j2\pi x}$, which is required for calculating case 2 of $W(a_{nm}, b_{nm})$, can be rewritten as follows:

$$e^{-j2\pi x}=\cos(2\pi x)-j\sin(2\pi x)=\cos^2(\pi x)-\sin^2(\pi x)-2j\sin(\pi x)\cos(\pi x) \quad (4.3)$$

This can make it possible to calculate the coefficients of sine and cosine only once and use these for all three cases of $W(a_{nm}, b_{nm})$. This can further accelerate the method.

Figure 5:
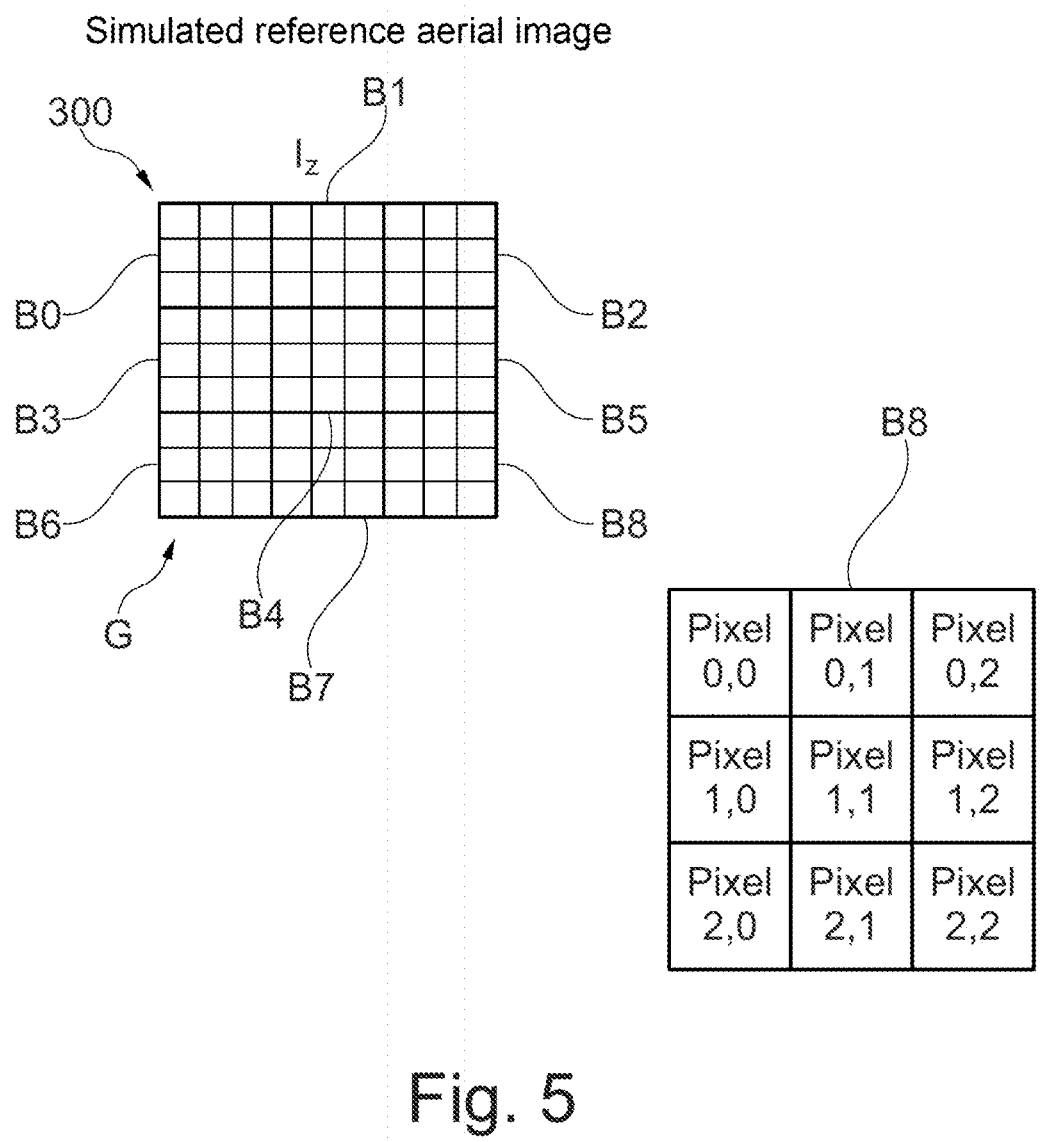
FIG. 5 shows a diagram for elucidating a part of a method according to one embodiment.

A diagram for elucidating a part of a method according to one embodiment is shown in FIG. 5.

The method described in conjunction with FIG. 5 can be used in step 1030 of FIG. 3.

A parallel calculation can be carried out in parallelized fashion by means of individual threads. Here, threads denote individual process steps, which can be worked through in parallel or in sequence. Blocks can denote threads bunched together on the basis of the available hardware. The overall problem that should be calculated can then be defined on a grid and denote bunching of blocks. Consequently, a specific problem can be defined on a grid and can then advantageously be calculated in parallelized fashion.

This procedure of working through the grid can be referred to as grid stride. By way of example, this can be realized by means of a grid-stride loop.

Such procedures can simplify a problem being carried out efficiently even on different hardware components because the distribution of the grid among the blocks can be chosen on the basis of the available hardware and can consequently be undertaken largely or completely independently of the specific problem.

In the present case, the reference aerial image 300 to be simulated can be described on a grid G and can be divided into a number of blocks B0 to B8 to this end. The reference aerial image can be calculated as an intensity of two spatial coordinates, for example u and v, for example as an intensity distribution I(u, v), as described above. The intensity distribution can be defined on the grid.

Here, it may be possible to calculate the individual pixels of the intensity distribution independently of one another. In such cases, the parallel calculation can be implemented pixel-by-pixel. To this end, the pixels can be grouped and be assigned to respective blocks, for example the blocks B0 to B8.

In exemplary fashion, block B8 is additionally illustrated in magnified fashion in FIG. 5. In the shown embodiment, the simulated reference aerial image 300 is sliced into nine blocks B0 to B8. Once again, each of the blocks B0 to B8 comprises nine pixels. An embodiment for block B8 is shown, the latter comprising the pixels 0, 0 to pixel 2, 2. Here, this embodiment is only schematic and the number of pixels can differ; in particular, neither the simulated reference aerial image 300 nor the blocks need to be constructed in square fashion.

Figure 6:
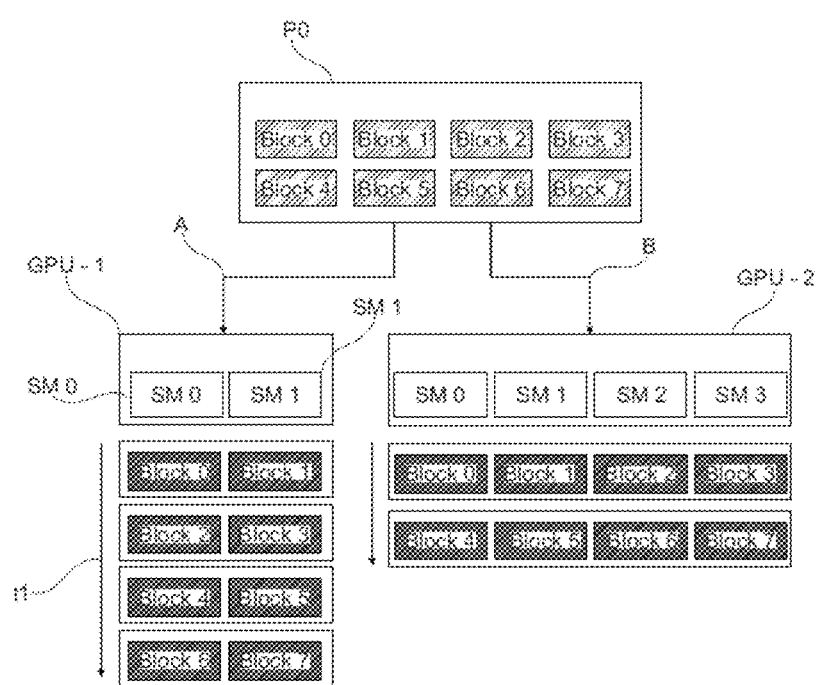
FIG. 6 shows how a parallelized calculation can be undertaken on the basis of an embodiment.

FIG. 6 shows, using the embodiment of a graphics processor, an example of how a parallelized calculation of the blocks of FIG. 5 can be undertaken with the aid of different computing devices.

In the shown embodiment of FIG. 6, a program P0 for a parallelized simulation of a reference aerial image is composed of eight blocks B0 to B7. Expressed differently, the embodiment shown in FIG. 6 uses one block less than the embodiment shown in FIG. 5.

In a first embodiment A of FIG. 6, a graphics processor GPU-1 with two streaming multiprocessors SMs, SM0, SM1, is available as the plurality of computing devices. Now, the respective blocks are calculated in temporal sequence T1. Since two streaming multiprocessors are available, it is blocks 0 and 1 that are calculated first, then blocks 2 and 3, followed by blocks 4 and 5 and finally followed by blocks 6 and 7. The sequence of the blocks is only listed here for illustrative purposes.

A different hardware configuration is available in a second embodiment B. In embodiment B, the plurality of computing devices is a graphics processor GPU-2 with four streaming multiprocessors SM0 to SM3. Accordingly, four blocks of the reference aerial image can be calculated simultaneously in parallel. In the shown embodiment of FIG. 6, embodiment B, blocks 0 to 3 are calculated first, subsequently followed by blocks 4 to 7. Here, the shown sequence and assignment to the streaming multiprocessors, just like in embodiment A, are specified as an embodiment and are modifiable as desired.

Figure 7:
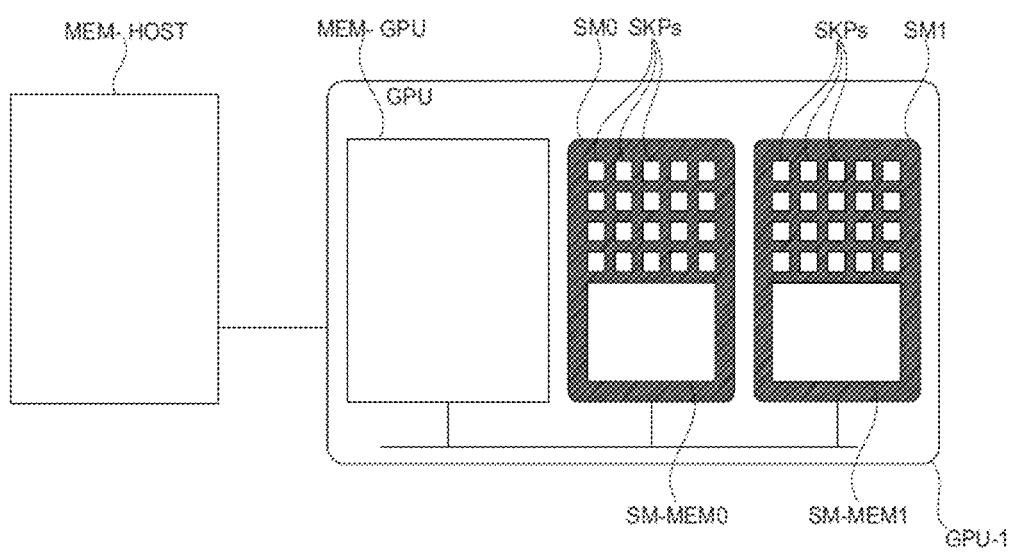
FIG. 7 shows an embodiment for subdividing the reference aerial image into blocks.

FIG. 7 shows an embodiment of an architecture of a computer with a graphics processor.

The shown architecture can provide the plurality of computing devices, as explained below.

The computer comprises a memory MEM-HOST and a graphics card GPU-1. By way of example, the graphics card GPU-1 of FIG. 7 can be the graphics card GPU-1 of FIG. 6. However, a different graphics card is also possible. In the shown embodiment of FIG. 7, the graphics card GPU-1 comprises streaming multiprocessors SM0, SM1. The streaming multiprocessors SM0, SM1 each comprise a plurality of scalar processors SKP and associated shared memories SM-MEM0 and SM-MEM1, respectively. Further, the graphics card GPU-1 comprises a graphics card memory MEM-GPU.

In some embodiments, the shared memory SM-MEM0, SM-MEM1 could be faster here than the graphics card memory MEM-GPU and/or the random access memory MEM-HOST. In such parallel processor units, the methods described here, with make do without downloading matrices into the memory, can be advantageous in that the plurality of discrete pupil functions can be loaded in a fast memory, for example the shared memory SM-MEM0 and/or SM-MEM1. As a result of this, the calculations of reference aerial images, particularly in the case of changes in the optical properties of the photolithography apparatus, can be carried out particularly quickly.

The parallel calculation can be implemented in various ways. By way of example, by means of the MEX interface of MATLAB, it can be implemented in a higher-level language, for example C/C++. As described above, the partially coherent image simulation can be carried out by means of various functions. These can be implemented as one-dimensional, two-dimensional and/or three-dimensional arrays, for example as complex floating point numbers with single or double precision.

By way of example, T can be specified as a two-dimensional array of complex numbers with double precision, K can be specified as a three-dimensional array of complex numbers with double precision, L can be specified as a one-dimensional array of complex numbers with single precision and J can be specified as a one-dimensional array of real numbers with double precision.

The MEX function can calculate one or more reference aerial images in parallel. The reference aerial image can be represented by a two-dimensional array of real numbers with single or double precision.

Figures 8A, 8B:
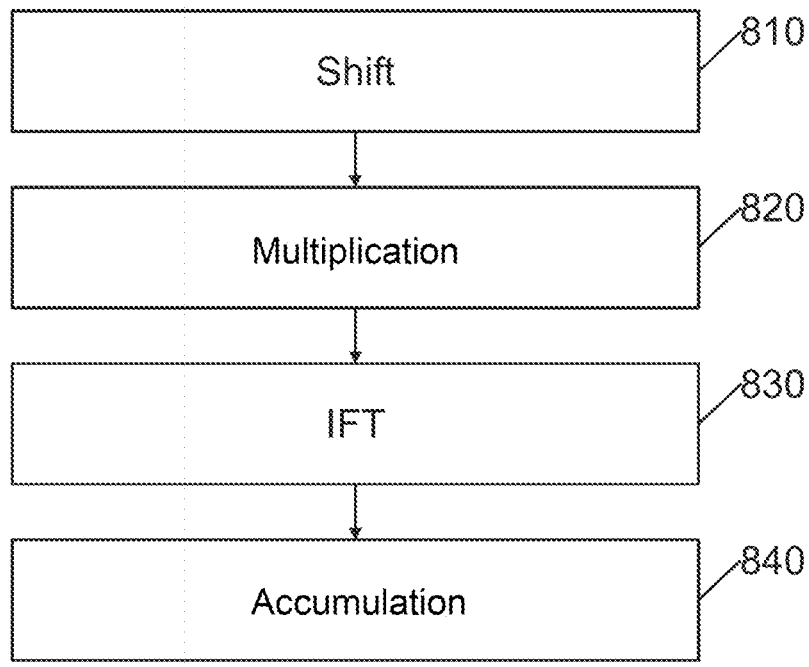
FIG. 8A shows a pseudo-code for a possible procedure for parallel or sequential calculation of an aerial image.
FIG. 8B shows a possible process control of an algorithm according to various embodiments.

FIG. 8A shows an example of a pseudo-code for a possible procedure for parallel or sequential calculation of an aerial image.

The shown pseudo-code is able, as per $$I_z(u, v) = \sum_i J(\alpha_i, \beta_i) |IFT[T(f - \alpha_i, g - \beta_i)_z(f, g)]|^2 \quad (2.17)$$

to calculate the aerial image $I_z$ for a respective focusing setting, denoted by $K_z$. Here, the index "z" is used to denote the focusing setting. As explained above, the index z can correspond to the notation "FE" for the focusing setting.

By way of example, Z=20 different focusing settings could be calculated, for example denoted by z=0 . . . 19.

Here IFT denotes a two-dimensional inverse Fourier transform.

$(\alpha_i, \beta_i)$ denote the coordinates of the i-th light source point and (f, g) denotes the coordinate notation of the IFT.

The two outer integrals over the light source were combined here in a single summation, which runs over a discretized two-dimensional light source, for example represented by a superposition of a plurality of light source points.

The pseudo-code shown in FIG. 8A requires four input arguments and supplies one output.

The output $I \in \mathbb{1}^{N \times M \times Z}$ is a third-order tensor, which describes the reference aerial image for each focal plane z.

The four input arguments are:
a vector $J \in \mathbb{1}^S$, which describes the light intensities for each light source point,
a vector $L \in \mathbb{C}^S$, which describes the coordinates of each light source point,
a matrix $T \in \mathbb{C}^{N \times M}$, which describes the Fourier spectrum of the mask, for example a mask transmission function, and
a third-order tensor $K \in \mathbb{C}^{N \times M \times Z}$, which describes the two-dimensional pupil function, for example the discrete pupil function, of the imaging system for Z focal planes.

The pseudo-code runs through all light source points by way of a loop and carries out the following steps:

1. Shifting the object spectrum T according to the illumination conditions,
2. Applying the discrete pupil function K of the imaging system to the shifted array and carrying out Z inverse Fourier transforms,
3. Accumulating the gain of the discrete Fourier transform, weighted by the common intensity function J, to form the reference image I.

The pupil-shift method, as implemented here and in the embodiment of FIG. 8A, runs through loops over a two-dimensional common intensity function J and a two-dimensional object T and an imaging system K.

The innermost two-dimensional Fourier transforms have, for example in their purest form, a complexity of $\mathcal{O}(M \times N)^2$. To simulate a single reference image, for example for a focusing setting z, the Fourier transform must be calculated S-times, where S is the dimensionality of the two-dimensional light source, for example $S=S_x \times S_y$.

In the pseudo-code of FIG. 8A, the pupil-shift method was extended to the effect of calculating reference images for Z different focal planes. Therefore, the method must be carried out Z-times. From a computational outlay—under the assumption of the costs for memory access being ignored—it is irrelevant whether the imaging simulation is carried out in all focal planes, as shown in FIG. 8A, or separately in each case for the individual focal planes.

Hence, the following overall complexity arises:

$$\mathcal{O}_{(S_x \times S_y \times (Z \times (M \times N)^2))} = \mathcal{O}_{(Z \times (S_x \times S_y \times (M \times N)^2))} \approx \mathcal{O}_{(Z \times n^6)} = \mathcal{O}_{(n^6)}$$

Here, Z as a constant factor, which does not depend on the complexity of the specific simulation problem, can be omitted since the various focal planes only require the simulation to be carried out Z-times.

The required computational operations are scalar multiplications and scalar additions and the already mentioned Fourier transforms, which represent the most computationally intensive part of the problem.

A possible flow control of this algorithm is shown in FIG. 8B.

The algorithm shown in FIG. 8B shows no branching that depends on conditions during the calculations.

FIG. 8B shows the dependence of implementation of the pupil-shift method, for example as per FIG. 8A, for a light source point. The calculation of light source points that do not depend on one another can be carried out simultaneously, for example in parallel, since the light source points are independent of one another.

The shown method includes the following steps:
The shift is determined at 810.
The multiplication of T by K is implemented at 820.
An inverse Fourier transform is performed at 830.
The image is created at 840 by accumulating the results of the Fourier transforms.

The steps at 810, 820 and 840 only contain scalar matrix operations. Consequently, the respective steps can be carried out simultaneously, for example in parallelized fashion.

It can likewise be observed that the input data for the algorithm need not be loaded again but can be used for all light source points. The memory transfer costs of the input data can be derived by virtue of considering the dimensions of a typical dataset.

These are given by:
N=M=300, Z=7 and S=17000.

If the assumption is made of double precision floating point numbers, the total memory required can be specified herefrom as follows:

sizeof(J)=sizeof(double)×S=136,000 bytes sizeof(L)=2×sizeof(double)×S=272,000 bytes sizeof(T)=2×sizeof(double)×N×M=1,440,000 byte:

sizeof(K)=2×sizeof(double)×N×M×Z=10,080,000 bytes

Consequently, a required input data size of approximately 11.4 MiB and sizeof(K)/2 bytes for the reference image I arise.

As explained in conjunction with FIGS. 8A and 8B, the problem of the reference image simulation is well-suited for calculation in parallelized fashion, for example on a GPU or a plurality of GPUs, on account of the following properties:
- negligible memory transfer costs,
- numerous (mainly scalar) operations that are applied to the input data and
- a simple and at the same time highly parallelizable flow control.

A possible procedure for the parallelized calculation is described in more detail below.

FIG. 8C shows an example of a pseudo-code for a possible procedure for parallel calculation of an aerial image.

The pseudo-code of FIG. 8C can be performed on a graphics processor, but other parallel implementations are also possible.

The following steps are carried out:
1. A loop runs through all light source points S, which are stored in a computing apparatus.
2. Intermediate results are cached in a memory, referenced by the variable fft_temp. By way of example, the memory can be the global graphics card memory MEM-GPU of FIG. 7.
3. Z two-dimensional inverse Fourier transforms are carried out. By way of example, the calculations can be performed in parallelized fashion on a graphics processing unit, for example on SM0 and SM1 of FIG. 7 and/or on SM0 and SM1 of GPU-1 or on SM0-SM3 of GPU-2 of FIG. 6.
4. The back-transformed intermediate result in fft_temp is accumulated by the function accumulate_image, for example added, in order to obtain the reference aerial image, for example after the loop has been completely run through.

The procedure described here may be advantageous in that the memory requirement may be low. By way of example, the memory requirement of the variable ffttemp may be restricted to N*M*Z*1 element, as described above in conjunction with FIG. 8B.

In an implementation with a graphics card, it may be necessary to perform three context switches between the CPU and the GPU. For large values of the number of light source points S, the overhead of these context switches may become dominant and therefore make this procedure inefficient.

In such cases, other procedures, as described below, may facilitate faster calculations. This is described below as the further-improved procedure.

FIG. 9 shows an example of a kernel which implements a scalar matrix multiplication as per Equation (2.6).

A kernel is a program which carries out parallel calculations on a computing apparatus, for example a graphics card, in order to solve a certain problem. For example, one kernel could perform an aerial image simulation according to Hopkins while another kernel could calculate a spectrum of the photomask analytically, for example.

The outer two loops that are used to run through the grid are referred to as grid-stride loops. These can run through a given thread grid, as explained in conjunction with FIG. 5. If the grid is large enough to store an entire dataset required for calculation purposes, these loops are only run through once. In other cases, the loops ensure that, in the case of other hardware configurations, the appropriate number of calculation steps are performed, for example as explained above in conjunction with FIG. 6 for cases A and B.

The inner loop performs the shift of T in accordance with the illumination conditions. Here, each thread obtains the shifted element of T by shifting the index with which T is accessed. In order to avoid an implementation-dependent behaviour if the operators of the remaining operations deviate in terms of the sign in lines 10 and 11 of FIG. 9, the numerator is forced to be positive in each case by adding the variables size.x and size.y.

The shifted element is multiplied by the respective element of each focal plane of the discrete pupil function K. The complex product is stored in the buffer fft_temp.

Here, the memory access to T remains coalesced because adjacent threads access adjacent elements of T.

In order to calculate the inverse Fourier transform, use can be made, for example, of the cuFFT library, which is part of the CUDA Software Development Kit (SDK). However, other libraries for the Fourier transform, for example for the fast Fourier transform (FFT), can also be used.

FIG. 10 shows an example of a possible implementation of the kernel which accumulates the output of the fast Fourier transform to form the reference image.

The two outer loops of FIG. 10 are the already described grid-stride loops.

The two inner loops calculate the square of the absolute values of the result of the complex fast Fourier transform for each focal plane and adds the respective result to the reference aerial image for the respective focal plane. A thread manages an element of fft_input in each focal plane.

The kernels, which were described in conjunction with FIGS. 9 and 10, can allow loops to run over buffers, which contain the matrices which are stored in a one-dimensional memory.

In the shown examples, the iteration of the matrix is implemented line by line by means of two loops for both kernels of FIGS. 9 and 10.

If such an implementation is undertaken, for example with CUDA, it is possible, for example, for 32 threads to run simultaneously on a GPU. In cases where the matrices are no multiple of 32, this may lead to the last threads of one or both loops being idle, for example if the condition x<size.x is not met. Should the threads access the elements, the accesses would, however, be well-defined since the matrices are stored in linear buffers. Therefore, the second loop can be considered to be an unnecessarily diverging branch. Consequently, the procedure can be further improved by virtue of the two outer loops being converted into a single loop.

This can further reduce the required computing time.

The code in FIG. 10 carries out the summation of the reference aerial image I in the global memory. The "+=" operator can be a read-modify-write operator. Writing to the global memory can be expensive and may lead to a cache containing I becoming invalid. In cases of unaligned or uncoalesced access, the subsequent read access can suffer under the access to the uncached global memory. This can increase the computing time.

Further-Improved Procedure: Parallelized Iteration of the Light Source Points

For a further improvement, the iteration of the light source points can likewise be performed in parallelized fashion, for example on a GPU. This may have advantages such as the avoidance of unnecessary kernel calls and/or reduced overhead, and consequently further reduce the required computing time.

By way of example, the methods described above could require seven kernels to image a light source point. Thus, mul_circshift3D_kernel and accumulate_image_kernel could each carry out one kernel and cuFFT could carry out up to five kernels. Consequently, 17 000 light source points would bring about 119 000 kernel starts. Consequently, it may be advantageous to be able to carry out each loop for each light source point on one GPU or on a different plurality of computing devices in order to reduce the number of kernel calls and, as a result thereof, the required overhead, for example.

However, in so doing, this approach may require fft_temp being stored in the associated memory of the GPU, for example MEM-GPU of FIG. 7.

In order to be able to perform all transformations within one iteration, it may be necessary for the buffer to have the size of the memory requirement of the elements N*M*Z*S, as described above in conjunction with FIG. 8B. This may lead to the memory size of fft_temp being able to be of the order of several gigabytes, for example 80 GB.

In this context, it should be noted that these memory requirements are greater than the hardware capabilities of currently available graphics cards. Additionally, a simulation of a greater number of light source points may be necessary and/or desirable, such that even other examples of a plurality of computing devices, which have a greater memory, for example of more than 100 GB, reach their limits.

Therefore, it may be advantageous to slice the problem in order to work with a given global GPU memory, for example MEM-GPU of FIG. 7.

To this end, the mul_circshift3d_kernel and accumulate_image_kernel kernels can be converted into a one-dimensional thread block by virtue of the outer two grid-stride loops being converted into a single loop. As mentioned above, this can avoid unnecessary diverging branches.

Since both kernels iterate over all light source points on the GPU in this variant, each iteration only respectively requires one element L(i) of the light source points L and J of all threads. A complete cache line of the GPU is loaded for each element, but only a single element is used.

If the program accesses a single element in the memory or even only a single memory cell, it is not only this individual element or this individual cell that can be loaded in some embodiments, but a certain component of adjacent memory can also be loaded at the same time. Here, it may be an object to also use this memory, which was also loaded virtually without additional costs, in directly following computation steps.

As a result of this, some embodiments can avoid a jump to a completely different location in the memory in the next calculation step and can consequently avoid discarding the memory loaded "without costs," for example the cache line. The size of a cache line is hardware-dependent and can be a power of 2. Typical sizes in current computing apparatuses are 64 bytes, sometimes even 128 bytes.

To avoid the remainder of the cache line being discarded, use can be made of a shared memory, for example SM-MEM0 and SM-MEM1 of FIG. 7, for caching the data. To ensure a better use of the shared memory, the employed data types, for example the data type of L, can be optimized. By way of example, L can be stored as short2. This can be possible if the following applies to all coordinates of the light source points:

$$\le \sqrt{N \times M}$$

In the case of signed 16 bit two's complement integers, the coordinates can lie in the interval [−32768; 32767].

Iterating over all light source points on the GPU may have the further advantage that the accumulate_image_kernel of FIG. 10 performs the summation of I in thread registers instead of global memory. As a result, the contribution of all light source points can be accumulated, for example added, in registers and only accumulated and/or copied once in the global memory to form the reference image. This can further accelerate the method since the faster memory SM-MEM0 and SM-MEM1 of FIG. 7 is used to a greater proportion.

Figures 11A, 11B:
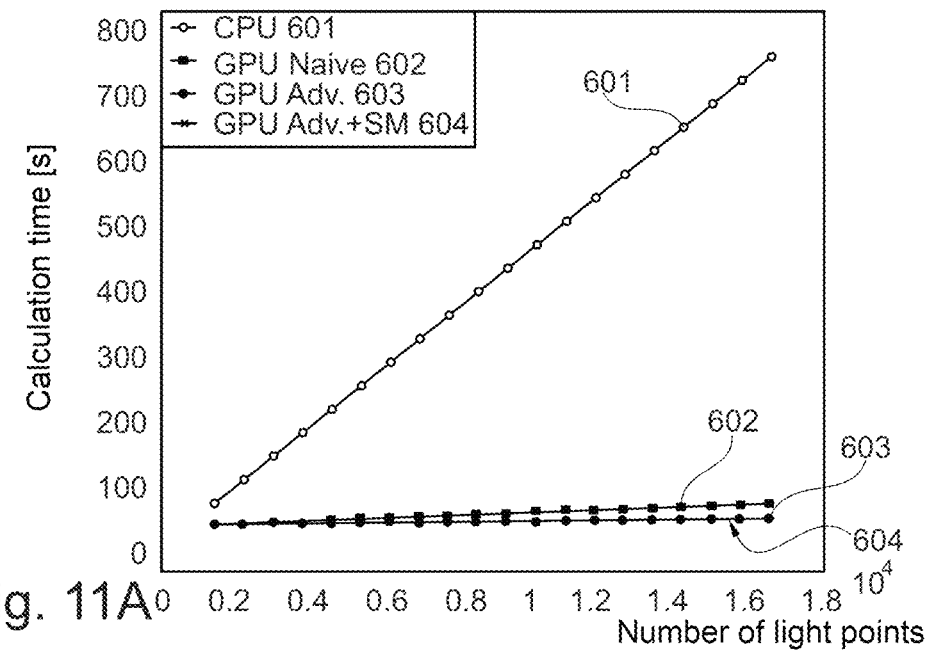
FIG. 11A and FIG. 11B show required calculation times of various implementations as per various embodiments, as a function of the number of light source points.

FIG. 11A and FIG. 11B show required calculation times of various implementations as per various embodiments, as a function of the number of light source points.

FIG. 11B specifies the corresponding numerical values to the relationships presented graphically in FIG. 11A.

Curve 601 shows a non-parallelized calculation, as known from the prior art. In the shown embodiment, the calculation is implemented by means of a CPU without parallelization. Curve 602 shows the above-described parallelized procedure and curve 603 shows the above-described further-improved procedure and curve 604 shows the above-described further-improved procedure, complemented by the use of shared memory, as likewise described above, according to various embodiments. As is evident from FIG. 11A, the parallelization described here achieves a significant acceleration, by a factor >10 and up to a factor of 52, for the reference aerial image calculation.

As is further evident from the curves of FIG. 11A, the implementations scale proportionally with the size of the problem. This is achieved by virtue of the fact that no communication or synchronization overhead is required in the described procedures and all calculations can be carried out simultaneously. The further-improved implementation is faster than the improved implementation by a factor of 3.

However, the use of the shared memory in the further-improved procedure was found to be non-advantageous in this embodiment. In the present example, the above-described slicing leads to synchronizations becoming necessary on the level of the thread blocks. This required synchronization overhead may lead to this procedure possibly being slightly slower than the further-improved procedure per se. Consequently, it may be advantageous in some situations to dispense with the use of the shared memory, as described above.

FIGS. 12A and 12B show quality of the parallelized calculations as per various embodiments.

Here, FIGS. 12A and 12B examine procedures which use the TCC matrix, as described above.

In FIG. 12A, the calculation time as a function of time is plotted on a first y-axis and a normalized intensity difference between the calculated image and the image calculated in parallelized fashion as a function of used number of eigenvalues N of the TCC matrix is plotted on a second y-axis.

Here, curve 701 shows that the calculation time increases with the number of eigenvalues used for the parallelized calculation method for ascertaining the TCC matrix. Curve 702 shows the mean deviation between a reference aerial image calculated with maximum precision and a reference aerial image calculated with a reduced number of eigenvalues N. Curve 703 shows the maximum deviation. As emerges from FIG. 12A, N can be chosen in accordance with the demands of the application and the required precision. The numerical values of the curves in FIG. 12A are plotted in FIG. 12B.

For one embodiment, N=60 can be chosen if an accuracy of $10^{-1}$ as maximum deviation 703 is acceptable for the application. This can lead to a significant increase in the calculation speed.

The number of eigenvalues can be chosen according to the application. It may be advantageous to choose the cardinality of the set of eigenvalues on the basis of the number of light source points used. Here, a>5 may hold true. Here, the following may hold true: a>5, for example a>10, for example a>15, for example a>20, for example a>25, for example a>30.

As an alternative or in addition thereto, between 50 and 1000, in particular between 100 and 500 eigenvalues, can be used to describe a mask.

Figures 13A, 13B:
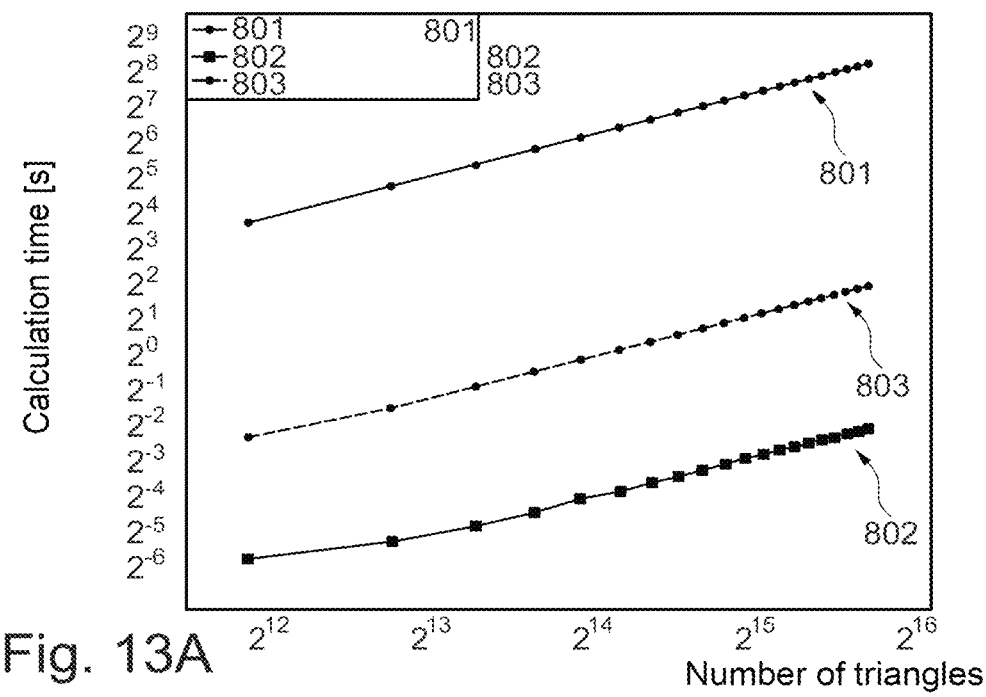
FIG. 13A and FIG. 13B show speed advantages of the parallel calculation with single precision.

FIGS. 13A and 13B show speed advantages of the parallel calculation with single precision.

In some embodiments in which shared memory is used, ten floating point numbers can be saved in the thread register. This can reduce the requirements of these registers, for example registers of the SKPs in FIG. 7. As a result of this, only 63 registers may be required per thread, for example. This may render it possible to use a maximum of 1024 threads per block.

In embodiments which do not use the shared memory or do not use it for this purpose, it may be advantageous to reduce the number of threads per block. Otherwise, so-called register spilling might occur and have a negative influence on the runtime, for example increase the latter by a factor of 100.

To avoid unnecessary multiplications during the runtime, it may be advantageous to skillfully choose bracketing of calculations. Floating point calculations are not associative; by way of example, the following applies:

$$(2 \cdot \pi) \cdot x \neq 2 \cdot (\pi \cdot x)$$

In order to facilitate constant folding for an optimizing compiler, it may be advantageous to place parentheses around expressions such as $$2 \cdot \pi$$

zu setzen.

In some embodiments, the atomic addition of the spectra of individual triangles to form the global spectrum does not impair the performance.

In some embodiments, the calculation of the sine and cosine terms is most time-consuming. Therefore, it may be advantageous not to calculate the sine and cosine terms separately but to calculate both terms together in a single computing step, for example by the CUDA-specific sincosf( ) function.

In some embodiments, the calculation of $W(a_{nm}, b_{nm})$ as per Equation (2.19) is implemented by means of IF blocks. This may lead to branchings. In embodiments in which the plurality of computing devices have a so-called single instruction, multiple data structure, SIMD structure, as may be the case for GPUs, for example, such branchings may have a negative influence on the performance if the execution of various threads branches.

However, some of the embodiments do not exhibit any negative effects since cases 1 and 2 of $W(a_{nm}, b_{nm})$ are only very unlikely to be true. Therefore, the branches do not lead to bottleneck-type behaviour in some embodiments.

In FIG. 13A, the calculation time is plotted as a function of the number of triangles. Curve 801 shows the dependence for a non-parallel computing method from the prior art. Curve 802 shows the relationship for calculations according to an embodiment with values with single precision; curve 803 shows a relationship for another embodiment with values with double precision. As is evident from FIG. 13A and the tabulated numerical values of FIG. 13B, a parallelized calculation with double precision can achieve a shortening of the calculation time by two orders of magnitude. By using a calculation with single precision, a further increase by more than one order of magnitude can be achieved.

In one embodiment with single precision, cf. curve 802, an intensity difference of $-1.892837 \times 10^{-6} + i1.046527 \times 10^{-5}$ from an implementation from the prior art is achieved for 62 656 triangles.

Here, the maximum of the intensity difference occurs in the vicinity of the frequency of 0.

In one embodiment with double precision, an intensity difference of $4.67629401697351 \times 10^{-10} + i4.43115737363925 \times 10^{-12}$ from an implementation from the prior art is achieved for the same conditions, cf. curve 803.

In some embodiments, the accuracy of the embodiment with single precision may be sufficient in this case. In some of these embodiments, the error does not propagate to the resultant reference aerial image.

It goes without saying that the features of the embodiments and aspects of the embodiments described above can be combined with one another. In particular, the features can be used not only in the combinations described but also in other combinations or on their own without departing from the scope of the embodiments.

The procedures described here can be used to carry out more accurate image simulation of any infinitely thin structure for the purposes of determining reference aerial images.

Here, apparatuses, methods and computer programs were provided, which implement the underlying partially coherent image simulation in highly parallelized fashion and which are provided in executable and scalable fashion for currently available graphics cards. As a result, in some examples, simulations can be accelerated by a factor of 54 in relation to conventional implementations.

In cases where the underlying optical system remains unchanged, for example in series simulations, the described optimization by means of the TCC matrix facilitates a further significant acceleration of the simulation by a factor of, e.g., 20.

The described procedures allow the hardware specifications to be varied without impairing the function of the presented solution.

The apparatuses, computer programs and methods described here can however be applied to any two-dimensional (i.e., infinitely thin) object.

In some implementations, in addition to the computing devices described above, the operations associated with processing of data described in this specification can be performed by a computer system that include one or more data processors for processing data, one or more storage devices for storing data, such as one or more databases, and/or one or more computer programs including instructions that when executed by the computer system causes the computer system to carry out the computations or processes described above. In some implementations, the computer system can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the data processing described above can be implemented using software for execution on one or more mobile computing devices, one or more local computing devices, one or more remote computing devices, and/or one or more cloud computing servers. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, Blu-ray disc, hard drive, or flash drive, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A method for determining a quality of a mask of a photolithography apparatus, including:
   receiving a design of the mask,
   receiving optical properties of the photolithography apparatus,
   calculating a reference aerial image on the basis of the design and the optical properties in parallel using a plurality of computing devices,
   receiving a measured aerial image,
   comparing the reference aerial image to the measured aerial image, and
   determining a quality of the mask on the basis of the comparison,
   wherein the parallel calculation of the reference aerial image is implemented on the basis of the pupil-shift method, the pupil-shift method being implemented for a parallel calculation with the plurality of computing devices,
   wherein the pupil-shift method comprises a common intensity function and a mask transmission function, and a discrete pupil function,
   wherein the discrete pupil function and the common intensity function are represented by a transmission cross coefficient matrix,
   determining a plurality of eigenvalues of the transmission cross coefficient matrix, selecting a set of eigenvalues from the plurality of eigenvalues, the cardinality of the set of eigenvalues being smaller than the cardinality of the plurality of eigenvalues, and carrying out the method for determining the quality of the mask with the set of eigenvalues, wherein the cardinality of the set of eigenvalues is smaller by a factor a than a number of light source points used, where a >5.

2. The method of claim 1, wherein at least one of the common intensity function or the mask transmission function is determined on the basis of the measured aerial image.

3. The method of claim 1, wherein the method includes:
representing the design of the mask by a set of k polygons,
carrying out an analytic spectrum calculation for the set of k polygons, and
determining the mask transmission function on the basis of the analytical spectrum calculation for polygons using a Fourier transform.

4. The method of claim 3, wherein the polygons are triangles.

5. The method of claim 1, wherein the method includes:
calculating a plurality of reference aerial images for an associated plurality of focusing settings, FE, of the lithography apparatus, with the transmission cross coefficient matrix been kept constant in each case and the calculation of the plurality of reference aerial images further including:
determining a plurality of discrete pupil functions, K(FE), with each discrete pupil function of the plurality of discrete pupil functions respectively being assigned to a focusing setting of the plurality of focusing settings, and
respectively carrying out the following for the plurality of discrete pupil functions:
determining a plurality of eigenvalues of the transmission cross coefficient matrix,
selecting a set of eigenvalues from the plurality of eigenvalues, the cardinality of the set of eigenvalues being smaller than the cardinality of the plurality of eigenvalues, and
carrying out the method for determining the quality of the mask with the set of eigenvalues.

6. The method of claim 5, furthermore including:
representing each of the discrete pupil functions of the plurality of discrete pupil functions, respectively as a matrix,
loading the plurality of discrete pupil functions into an associated memory and
calculating the plurality of reference aerial images without downloading matrices into the associated memory.

7. The method of claim 1, wherein the pupil-shift method comprises one or more multiplications of matrices, wherein at least one of the multiplications of matrices is carried out by means of scalar multiplication.

8. The method of claim 1, wherein the method is carried out in the plurality of computing devices using single precision floating point values.

9. The method of claim 1, wherein the measured aerial image was measured in at least one of:
the photolithography apparatus, or
a photomask qualification apparatus.

10. A computer program having program code stored on a non-transitory medium which causes the method of claim 1 to be carried out when the program code is executed on a plurality of computing devices.

11. An apparatus for mask characterization, comprising:
at least one computing apparatus comprising a plurality of computing devices, wherein the plurality of parallel processor units are configured to carry out the method of claim 1, and
a measuring apparatus, which is configured to determine the measured aerial image and provide the latter for the computing apparatus.

12. The apparatus of claim 11, wherein the measuring apparatus is disposed in at least one of a photolithography apparatus or a photomask qualification apparatus.

13. The apparatus of claim 11, wherein the pupil-shift method comprises:
a common intensity function and a mask transmission function, and a discrete pupil function.

14. The apparatus of claim 11, wherein at least one of the common intensity function or the mask transmission function is determined on the basis of the measured aerial image.

15. The apparatus of claim 11, wherein the discrete pupil function and the common intensity function are represented by a transmission cross coefficient matrix.

16. The apparatus of claim 11, wherein the plurality of parallel processor units are configured to carry out:
determining a plurality of eigenvalues of the transmission cross coefficient matrix,
selecting a set of eigenvalues from the plurality of eigenvalues, the cardinality of the set of eigenvalues being smaller than the cardinality of the plurality of eigenvalues, and
carrying out the method for determining the quality of the mask with the set of eigenvalues.

* * * * *

UNITED STATES PATENT AND TRADEMARK OFFICE
CERTIFICATE OF CORRECTION

PATENT NO. : 11,631,168 B2
APPLICATION NO. : 16/912951
DATED : April 18, 2023
INVENTOR(S) : Tom Moebert et al.

It is certified that error appears in the above-identified patent and that said Letters Patent is hereby corrected as shown below:

On the Title Page

Page 2
Column 1 item (56) (Other Publications), Line 5, delete "Hemutian" and insert -- Hermitian --

In the Specification

Column 2
Line 62, delete "wfindex" and insert -- w/index --

Column 3
Line 38, delete "(12)" and insert -- 25(12) --

Column 5
Line 62, delete "$p_N+t = p1$" and insert -- $p_{N+1} = p1$ --
Line 67 (Approx.), delete "$[p_k, p_{k+1}] = \{(1-t)\ p_{k+1}\ p_{k+1}: 0 \leq t \leq 1\}$" and insert -- $[p_k, p_{k+1}] = \{(1-t)\ p_k + t\ p_{k+1}: 0 \leq t \leq 1\}$ --

Column 6
Line 21 (Approx.), before "is" insert -- of P --

Lines 41-42 (Approx.), delete "$\int_0^1 e^{i\omega((1-t)p_k + ip_{k+1})} dt$," and insert
-- $\int_0^1 e^{-i\omega((1-t)p_k + tp_{k+1})} dt$ --

Column 9
Line 59, delete "FIGS. 1A" and insert -- FIGS. 11A --

Column 11
Line 31, delete "u, y, x" and insert -- u, v, x --

Signed and Sealed this
Twenty-sixth Day of December, 2023

*Katherine Kelly Vidal*
*Director of the United States Patent and Trademark Office*

Column 14
Lines 13-15 (Approx.), delete

"$I(u,v) = \iiiint TCC(x_1, y_1, x_2, y_2) T(x_1, y_2) e^{j2\pi((x_1-x_2)u+(y_1-y_2)v)}(dx_1 dx_2 dy_1 dy_2$ $TCC(x_1, y_1, x_2, y_2) = \iint J(f,g) K(f+x_1, g+y_1) K^*(f+x_2, g+y_2) df dg$ (2.7)", and insert $I(u,v) = \iiiint TCC(x_1, y_1, x_2, y_2) T(x_1, y_1) T^*(x_2, y_2) e^{j2\pi((x_1-x_2)u+(y_1-y_2)v)} dx_1 dx_2 dy_1 dy_2$ $TCC(x_1, y_1, x_2, y_2) = \iint J(f,g) K(f+x_1, g+y_1) K^*(f+x_2, g+y_2) df dg$ (2.7) --

Column 16
Lines 3-9 (Approx.), delete

"$a_{nm} = \frac{n(x_{k2} - x_{k1})}{a} + \frac{m(y_{k2} - y_{k1})}{b}$ (2.18)

$b_{nm} = \frac{n(x_{k3} - x_{k1})}{a} + \frac{m(y_{k3} - y_{k1})}{b}$ $c_{nm} = \frac{nx_{k1}}{a} + \partial_{my_{k1}} b$ " and insert $a_{nm} = \frac{n(x_{k2} - x_{k1})}{a} + \frac{m(y_{k2} - y_{k1})}{b}$ $b_{nm} = \frac{n(x_{k3} - x_{k1})}{a} + \frac{m(y_{k3} - y_{k1})}{b}$ $c_{nm} = \frac{nx_{k1}}{a} + \frac{my_{k1}}{b}$ (2.18) --

Line 46, delete "ti" and insert -- $t_k$ --

Column 17
Line 13 (Approx.), delete "cos(–πx) + j sin(–πx) = cos(πx) – j sin(πz)    (4.2)" and insert
-- cos(–πx) + j sin(–πx) = cos(πx) – j sin (πx)    (4.2) --

Column 19
Line 16 (Approx.), delete

"$I_z(u,v) = \sum_i J(\alpha_i, \beta_i) |IFT[T(f-\alpha_i, g-\beta_i)_z(f,g)]|^2$ (2.17)" and insert $I_z(u,v) = \sum_i J(\alpha_i, \beta_i) |IFT[T(f-\alpha_i, g-\beta_i) K_z(f,g)]|^2$ (2.17) --

Line 38 (Approx.), delete "$I \in \mathbb{1}^{N \times M \times Z}$" and insert -- $I \in \mathbb{R}^{N \times M \times Z}$ --

CERTIFICATE OF CORRECTION (continued)
U.S. Pat. No. 11,631,168 B2

Line 41 (Approx.), delete "$J \in \mathbb{1}^S$" and insert -- $J \in \mathbb{R}^S,$ --
Line 66, delete "$\mathcal{O}(M \times N)^2)$" and insert -- $\mathcal{O}((M \times N)^2)$ --

Column 20
Line 58 (Approx.), delete "byte:" and insert -- bytes --

Column 21
Line 34, delete "ffttemp" and insert -- fft_temp --